(12) United States Patent
Do et al.

(10) Patent No.: US 8,735,224 B2
(45) Date of Patent: May 27, 2014

(54) INTEGRATED CIRCUIT PACKAGING SYSTEM WITH ROUTED CIRCUIT LEAD ARRAY AND METHOD OF MANUFACTURE THEREOF

(75) Inventors: Byung Tai Do, Singapore (SG); Arnel Senosa Trasporto, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 244 days.

(21) Appl. No.: 13/102,044

(22) Filed: May 5, 2011

(65) Prior Publication Data

US 2012/0280390 A1  Nov. 8, 2012

Related U.S. Application Data

(60) Provisional application No. 61/442,797, filed on Feb. 14, 2011.

(51) Int. Cl.
*H01L 21/44* (2006.01)
*H01L 21/48* (2006.01)
*H01L 21/50* (2006.01)

(52) U.S. Cl.
USPC .......... 438/123; 257/676; 257/E23.031; 257/E21.505

(58) Field of Classification Search
None
See application file for complete search history.

(56) References Cited

U.S. PATENT DOCUMENTS

| 6,238,952 | B1 | 5/2001 | Lin |
| 6,255,740 | B1 | 7/2001 | Tsuji et al. |
| 6,498,099 | B1 | 12/2002 | McLellan et al. |
| 6,562,660 | B1 | 5/2003 | Sakamoto et al. |
| 6,884,652 | B2 | 4/2005 | Huang et al. |
| 6,984,877 | B2 | 1/2006 | Lee et al. |
| 7,405,106 | B2 | 7/2008 | Maloney et al. |
| 7,423,340 | B2 | 9/2008 | Huang et al. |
| 7,638,879 | B2 | 12/2009 | Jiang et al. |
| 7,816,187 | B2 | 10/2010 | Huang et al. |
| 2003/0006055 | A1 | 1/2003 | Chien-Hung et al. |
| 2008/0308951 | A1 | 12/2008 | Li et al. |
| 2009/0102063 | A1 | 4/2009 | Lee et al. |
| 2010/0052146 | A1 | 3/2010 | Jiang et al. |
| 2010/0224971 | A1 | 9/2010 | Li |
| 2012/0139104 | A1* | 6/2012 | Camacho et al. ............ 257/737 |

FOREIGN PATENT DOCUMENTS

| CN | 101814482 A | 8/2010 |
| CN | 101814481 A | 8/2011 |
| KR | 20020031881 A | 5/2002 |

OTHER PUBLICATIONS

U.S. Appl. No. 12/618,417, filed Nov. 13, 2009, Camacho et al.
U.S. Appl. No. 12/961,489, filed Dec. 6, 2010, Camacho et al.
U.S. Appl. No. 12/961,490, filed Dec. 6, 2010, Bathan et al.
U.S. Appl. No. 12/890,409, filed Sep. 24, 2010, Do et al.
U.S. Appl. No. 12/789,077, filed May 27, 2010, Camacho et al.
U.S. Appl. No. 13/102,047, filed May 5, 2011, Do et al.
U.S. Appl. No. 12/878,661, filed Sep. 9, 2010, Pagaila.

* cited by examiner

*Primary Examiner* — Thien F Tran
(74) *Attorney, Agent, or Firm* — Ishimaru & Associates LLP

(57) ABSTRACT

A method of manufacture of an integrated circuit packaging system includes: providing a terminal having a top with a depression; applying a dielectric material in the depression, the dielectric material having a gap formed therein and exposing a portion of the top therefrom; forming a trace within the gap and in direct contact with the top, the trace extending laterally over an upper surface of the dielectric material; and connecting an integrated circuit to the terminal through the trace.

10 Claims, 17 Drawing Sheets

INTEGRATED CIRCUIT PACKAGING SYSTEM WITH ROUTED CIRCUIT LEAD ARRAY AND METHOD OF MANUFACTURE THEREOF

CROSS-REFERENCE TO RELATED APPLICATION(S)

The present application contains subject matter related to concurrently filed U.S. patent application Ser. No. 13/102, 041, now U.S. Pat. No. 8,557,638, and the subject matter thereof is incorporated herein by reference thereto.

TECHNICAL FIELD

The present invention relates generally to an integrated circuit packaging system and more particularly to a system for utilizing a lead frame in an integrated circuit packaging system.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a terminal having a top with a depression; applying a dielectric material in the depression, the dielectric material having a gap formed therein and exposing a portion of the top therefrom; forming a trace within the gap and in direct contact with the top, the trace extending laterally over an upper surface of the dielectric material; and connecting an integrated circuit to the terminal through the trace.

The present invention provides an integrated circuit packaging system, including: a terminal having a top with a depression; a dielectric material in the depression, the dielectric material having a gap formed therein and exposing a portion of the top therefrom; a trace within the gap and in direct contact with the top, the trace extending laterally over an upper surface of the dielectric material; and an integrated circuit connected to the terminal through the trace.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
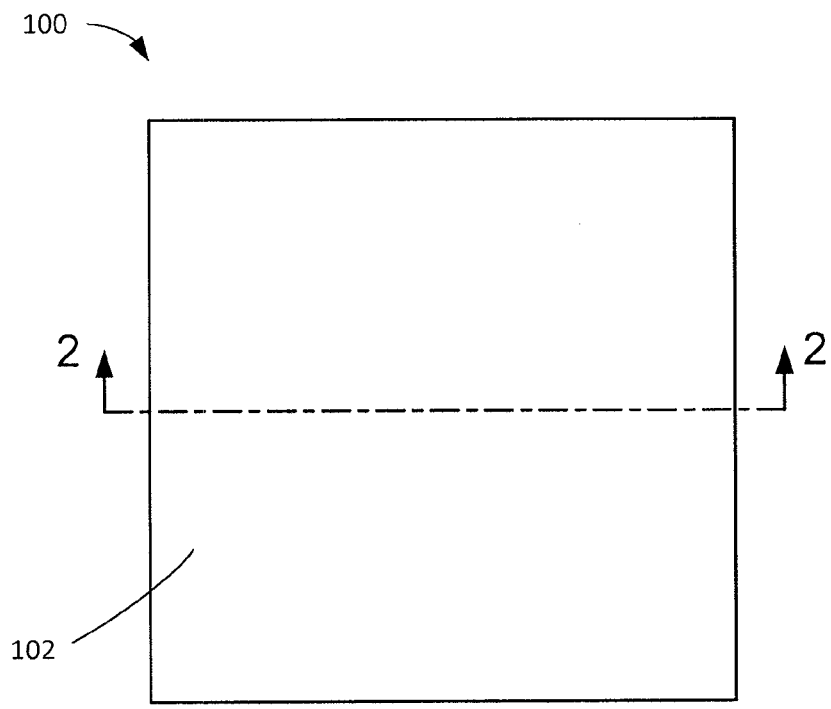
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. As an exemplary illustration, the integrated circuit packaging system 100 can generally be used within a portable electronics device that requires a high level of functional integration, such as a cellphone or computer. The integrated circuit packaging system 100 can include an encapsulation 102. The encapsulation 102 is defined as a cover surrounding and protecting the contents in the integrated circuit packaging system 100 from the environment. The encapsulation 102 can be film assist molding or other encasement structure.

Figure 2:
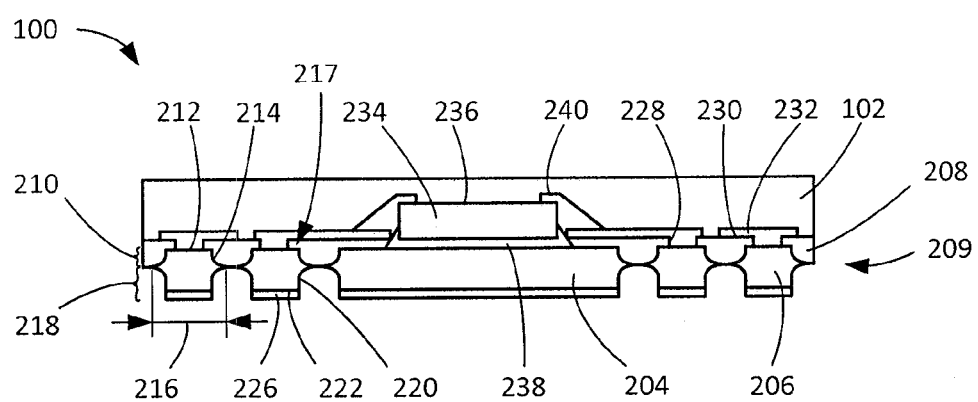
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 can include a die pad 204 and terminals 206. The terminals 206 are defined as a conductor designed to provide clearance for structures above the terminal and having lateral isolation from direct contact with other terminals; for this reason the terminals 206 are also known as standoff terminals.

Above the terminal 206 is a dielectric material 208. The dielectric material 208 is deposited in direct contact with the die pad 204 and the terminals 206. The dielectric material 208 is shown formed between the terminals 206. The dielectric material 208 is further shown formed between the terminals 206 and the die pad 204. The dielectric material 208 rigidly couples the terminals 206 and the die pad 204 in place to form a substrate 209.

The terminals 206 are shown having a top 210. The top 210 of the terminals 206 can include a plateau 212 and also include depressions 214 extending from the plateau 212 to a maximum width 216 of the terminals 206. The dielectric material 208 is in direct contact with a peripheral portion 217 at the plateau 212 of the top 210 of the terminals 206 from the plateau 212 to the maximum width 216 of the terminals 206 and fills in the depressions 214.

Below the maximum width 216 of the terminals 206 is a bottom portion 218 extending down from the maximum width 216 of the terminals 206. The bottom portion 218 can include a dent 220 extending down from the maximum width 216 to a base 222 of the bottom portion 218. The base 222 is depicted as planar or flat. The bottom portion 218 is depicted as slightly larger or taller than the top 210 providing increased standoff distance and clearance.

Covering some of the bottom portion 218 is a contact layer 226. The contact layer 226 is defined as a material on the surface of the terminals 206 and form electrical connections with other components. The contact layer 226 can be a solder paste, a layer containing tin or lead, or a conductive high temperature polymer. The contact layer 226 can cover some of the bottom portion 218 of the terminals 206 with a conformal layer with a uniform thickness.

The contact layer 226 is shown covering the bottom portion 218 surface of the terminals 206 with an even and conformal film along the base 222. The contact layer 226 is further depicted covering the underside of the die pad 204.

It has been discovered that the contact layer 226 formed on the base 222 increases solder coverage. Increasing solder coverage with the terminals 206 and the die pad 204 increases board level reliability and performance. The contact layer 226 of the present invention further can be formed by a printing process thereby increasing manufacturing precision without additional costs.

The top 210 of the terminals 206 are shown having the dielectric material 208 formed thereon. The dielectric material 208 can include gaps 228 on the top 210 that expose portions of the plateau 212 from between the dielectric material 208. The gaps 228 are defined as an opening or absence of the dielectric material 208 that exposes portions of the plateau 212 from between the dielectric material 208. The dielectric material 208 can be designed to support the terminals 206 during process and to increase structural rigidity in the integrated circuit packaging system 100. The dielectric material 208 is designed to increase reliability and structural rigidity in the form of the dielectric material 208 filling in the depressions 214 and having smaller gaps 228 on the plateau 212.

On an upper surface 230 of the dielectric material 208 are traces 232. The traces 232 are formed within the gaps 228 to electrically connect to and directly contact the plateau 212 of the terminals 206 exposed by the gaps 228 between the dielectric material 208. The traces 232 are defined as conductive elements designed to redistribute electrical signals. The traces 232 are designed to redistribute electrical signals in that they are generally electrically isolated, not excessively large to reduce the introduction of parasitic inductance and do not cover the entire upper surface 230 of the dielectric material 208.

It has been discovered that the traces 232 of the present invention when coupled with the terminals 206 and formed on the dielectric material 208 enable efficient high thermal performance of the substrate 209. The combination of the traces 232, the dielectric material 208, and the terminals 206 has been discovered to have improved thermal and electrical properties when combined. Improving the integrated circuit packaging systems 100 thermal performance increases the opportunity to utilize the present invention in multiple areas of high stress and high temperature applications.

Above the die pad 204 is an integrated circuit 234 depicted as a wire-bonded die having an active side 236 facing away from the die pad 204. The wire-bonded die 234 is attached to the die pad 204 with an adhesive 238.

It has been discovered that the die pad 204 provides structural stability and decreased risk of delamination from the integrated circuit 234. The structural support provided by the die pad 204 has been discovered to increase reliability and performance of the integrated circuit packaging system 100.

The active side 236 of the integrated circuit 234 is electrically connected to the traces 232 with interconnects 240 depicted as bond wires 240. The bond wires 240 are shown in direct contact with the traces 232 at various points along the trace 232. The bond wires 240 can be connected over the gaps 228, along the trace near the integrated circuit 234, spaced at an optimal distance there between, or on a portion of the trace 232 beyond the gaps 228 and away from the integrated circuit 234.

It has been discovered that the traces 232 provide improved electrical performance by allowing the utilization of shorter bond wires 240. This improvement is found because the width of the traces 232 is larger than a width of the interconnects 240 thus inducing less electrical resistance and inductance thereby increasing high frequency performance. Further, utilizing the traces 232 along with the terminals 206 of the present invention decreases the length of the interconnects 240 required for effective signal propagation to external devices and systems. Decreasing the length of the interconnects 240 decreases manufacturing costs by reducing the amount of costly material used, like gold, in the process of wire bonding the integrated circuit 234.

Around the integrated circuit 234 the interconnects 240 and the traces 232 is an encapsulation 102. The encapsulation 102 can be glob top, film assist molding, or other encasement structure.

It has been discovered that utilizing the traces 232 of the present invention in conjunction with the interconnects 240 and the encapsulation 102 decreases production costs and complexity by decreasing bond wire 240 span. It has also been discovered that utilizing the traces 232 of the present invention in conjunction with the interconnects 240 and the encapsulation 102 decreases production costs and complexity by providing a well laid out system for electrically connecting the integrated circuit 234 to the terminals 206 without requiring the interconnects 240 to cross one another. Since the complexity of the bond wire 240 configuration is substantially decreased a less expensive non-compression molding can be employed.

The wire-bonded die 234 can optionally be connected to the terminals 206 directly with the interconnects 240 having the interconnects 240 in direct contact with the terminals 206 and isolated from the traces 232. The wire-bonded die 234 can further employ a hybrid approach allowing for some connections to the terminals 206 to be direct and others to be made through the traces 232.

Multiple layers of the traces 232 and the dielectric material 208 can be formed to enable signal routing with many more connection points. The traces 232 can be fused together to enable power, ground, or signals to be routed to multiple terminals 206 or multiple bond wires 240. The terminals 206 are depicted in a multi row configuration designed to efficiently utilize the full space below the integrated circuit packaging system 100 size and enables yet shorter bond wires 240.

Figure 3:
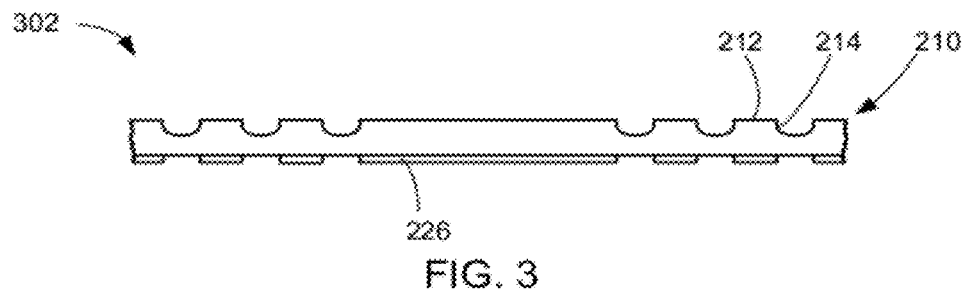
FIG. 3 is a cross-sectional view of a leadframe assembly for manufacture of the integrated circuit packaging system of FIG. 2 after a providing phase of manufacture.

Referring now to FIG. 3, therein is shown a cross-sectional view of a leadframe assembly 302 for manufacture of the integrated circuit packaging system 100 of FIG. 2 after a providing phase of manufacture. The leadframe assembly 302 can include the plateau 212 and the depressions 214 formed on the top 210. The leadframe assembly 302 is defined as an electrically conductive leadframe assembly that provides manufacturing support and is incorporated into the integrated circuit packaging system 100 of FIG. 1.

The leadframe assembly 302 can be a metallic composition including copper. The leadframe assembly 302 includes the contact layer 226 that is further shown attached by plating or sputtering beneath the leadframe assembly 302 in selective areas rather than fully coating below the leadframe assembly 302.

Figure 4:
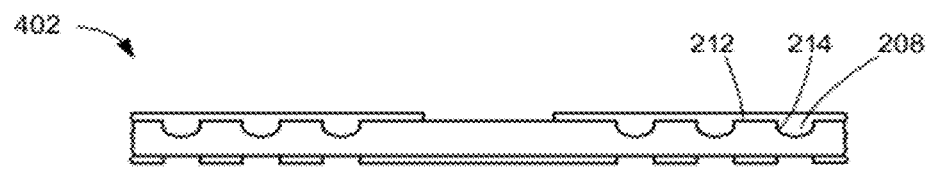
FIG. 4 is a cross-sectional view of a structure after a dielectric application phase of manufacture.

Referring now to FIG. 4, therein is shown a cross-sectional view of a structure 402 after a dielectric application phase of manufacture. The structure 402 can include the dielectric material 208 deposited above the structure 402 on the plateau 212 and within the depressions 214.

Figure 5:
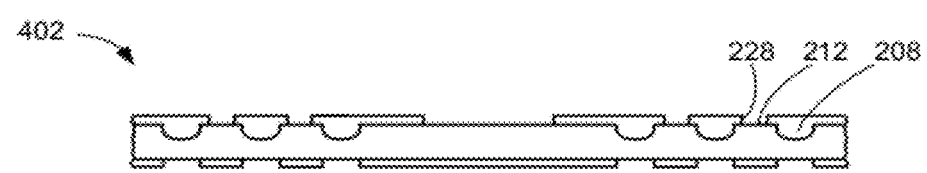
FIG. 5 is a cross-sectional view of the structure of FIG. 4 after a gap formation phase of manufacture.

Referring now to FIG. 5, therein is shown a cross-sectional view of a structure 402 of FIG. 4 after a gap formation phase of manufacture. The structure 402 can include the dielectric material 208 processed to form the gaps 228 exposing the plateau 212 from the dielectric material 208.

Figure 6:
FIG. 6 is a cross-sectional view of the structure of FIG. 5 after a trace formation phase of manufacture.

Referring now to FIG. 6, therein is shown a cross-sectional view of the structure 402 of FIG. 5 after a trace formation phase of manufacture. The structure 402 can include the traces 232 formed on the upper surface 230 of the dielectric material 208 and within the gaps 228 to make direct electrical contact with the plateau 212.

Figure 7:
FIG. 7 is a cross-sectional view of the structure of FIG. 6 after a selective plating phase of manufacture.

Referring now to FIG. 7, therein is shown a cross-sectional view of the structure 402 of FIG. 6 after a selective plating phase of manufacture. The structure 402 can include the traces 232 more fully formed with selective plating. Selective plating can include additional layers of nickel, or layers of an amalgam like nickel/palladium/gold. The selective plating can be formed on the structure 402 or on the traces 232.

Figure 8:
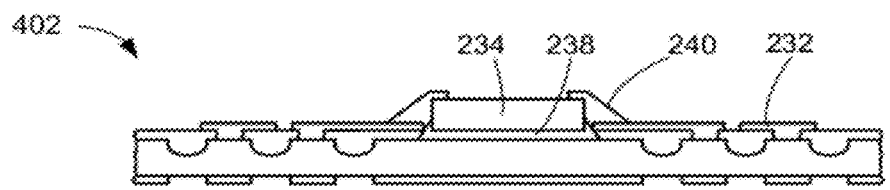
FIG. 8 is a cross-sectional view of the structure of FIG. 7 after a wire bond phase of manufacture.

Referring now to FIG. 8, therein is shown a cross-sectional view of the structure 402 of FIG. 7 after a wire bond phase of manufacture. The structure 402 can include the integrated circuit 234 attached to the structure 402 with the adhesive 238 and connected to the traces 232 with the interconnects 240.

Figure 9:
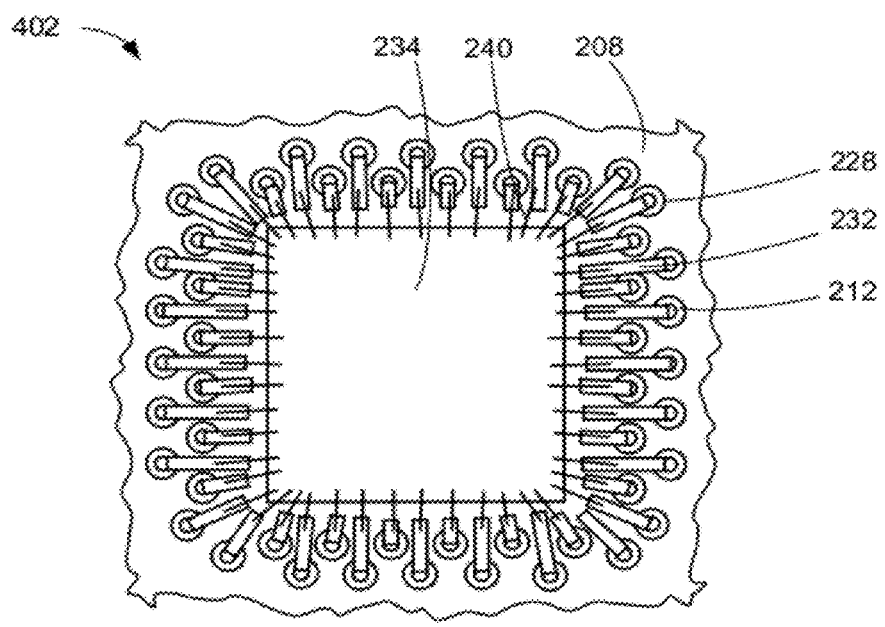
FIG. 9 is a top view of the structure of FIG. 8.

Referring now to FIG. 9, therein is shown a top view of the structure 402 of FIG. 8. The structure 402 can include the traces 232 formed over the dielectric material 208 and within the gaps 228. The traces 232 are shown formed only within a portion of the gaps 228 and not filling entirely the gaps 228 leaving portions of the plateau 212 exposed from both the dielectric material 208 and the traces 232.

The traces 232 are shown formed from the gaps 228 in toward the integrated circuit 234 thus reducing the length of the interconnects 240 that must be used. The traces 232 are shown largely formed toward the integrated circuit 234 but can be formed in other directions to merge the traces 232 or to better distribute the placement of the interconnects 240.

Figure 10:
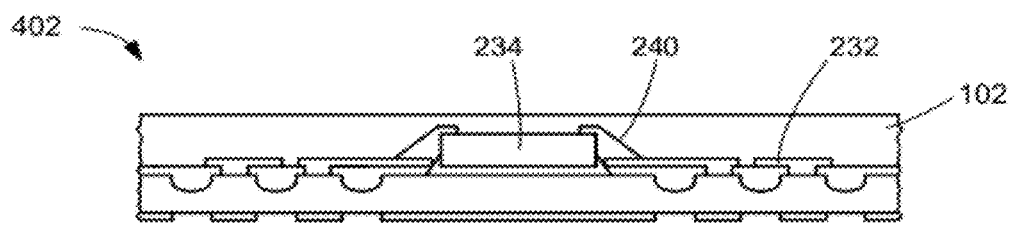
FIG. 10 is a cross-sectional view of the structure of FIG. 8 after a mold phase of manufacture.

Referring now to FIG. 10, therein is shown a cross-sectional view of the structure 402 of FIG. 8 after a mold phase of manufacture. The structure 402 can include the encapsulation 102 formed over the integrated circuit 234, the interconnects 240, and the traces 232. The encapsulation 102 fills in between the traces 232.

Figure 11:
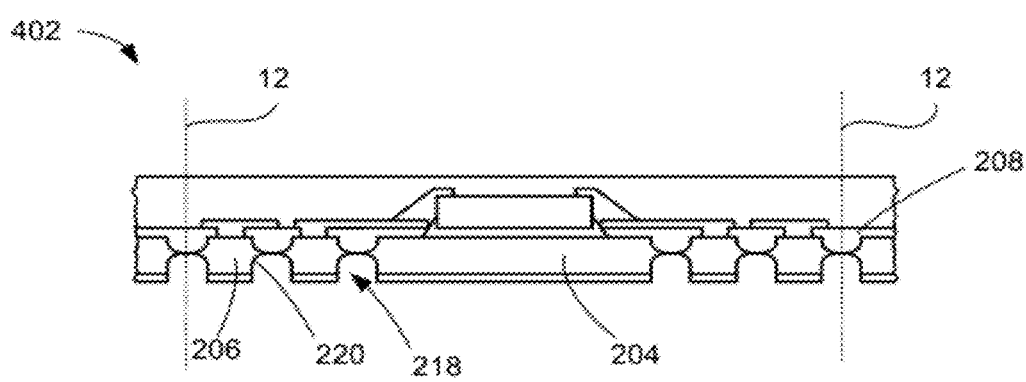
FIG. 11 is a cross-sectional view of the structure of FIG. 10 after an etch phase of manufacture.

Referring now to FIG. 11, therein is shown a cross-sectional view of the structure 402 of FIG. 10 after an etch phase of manufacture. The structure 402 can include the dent 220 formed in the bottom portion 218 of the terminals 206. The dielectric material 208 is exposed at this step from between the terminals 206 and from between the terminals 206 and the die pad 204. The terminals 206 are physically isolated at this point from each other and from the die pad 204.

Figure 12:
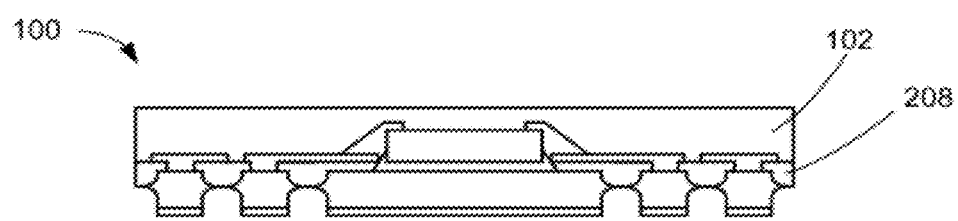
FIG. 12 is a cross-sectional view of the integrated circuit packaging system of FIG. 2 after a singulation phase of manufacture.

Referring now to FIG. 12, therein is shown a cross-sectional view of the integrated circuit packaging system 100 of FIG. 2 after a singulation phase of manufacture. The integrated circuit packaging system 100 can include the encapsulation 102 and the dielectric material 208 singulated along the singulation lines 12-12 of FIG. 11 to form the integrated circuit packaging system 100.

Figure 13:
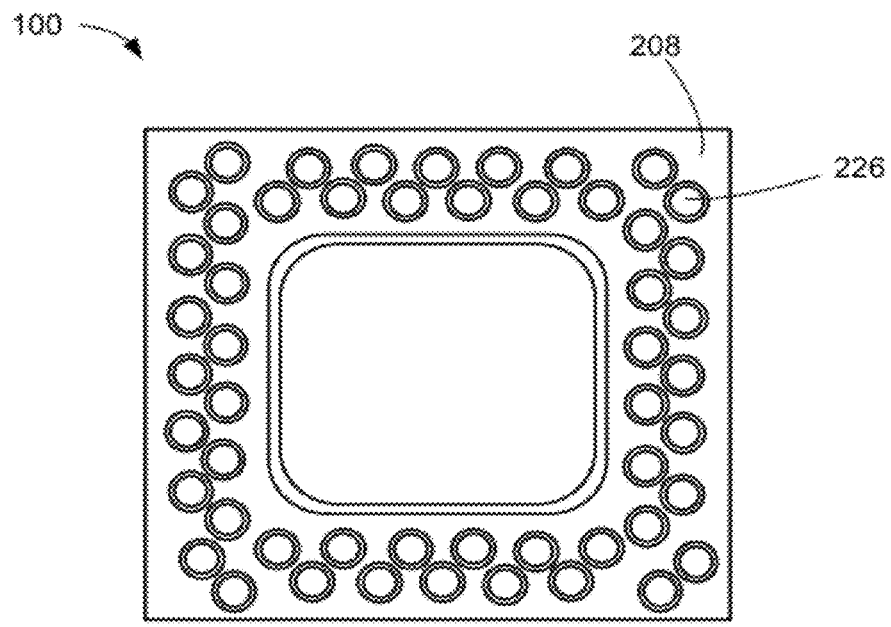
FIG. 13 is a bottom view of the integrated circuit packaging system of FIG. 12.

Referring now to FIG. 13, therein is shown a bottom view of the integrated circuit packaging system 100 of FIG. 12. The integrated circuit packaging system 100 can include the contact layer 226 over the dielectric material 208. The contact layer 226 can include a staggered pattern to increase the contact area and decrease the possibility of shorting connections.

Figure 14:
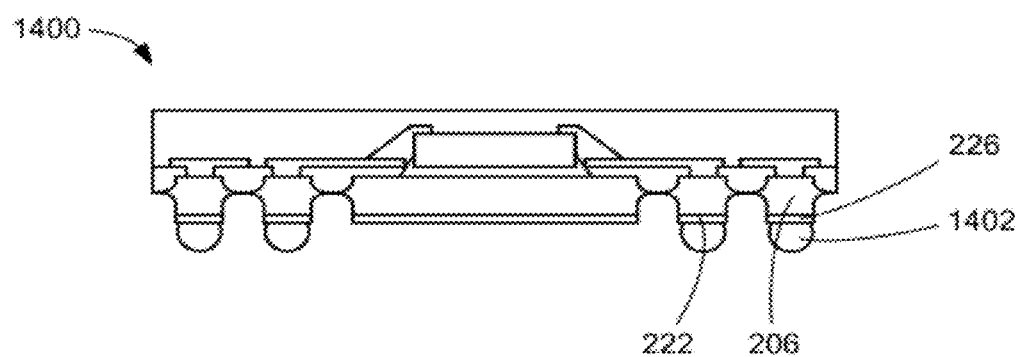
FIG. 14 is a cross-sectional view of an integrated circuit packaging system in a second embodiment of the present invention.

Referring now to FIG. 14, therein is shown a cross-sectional view of an integrated circuit packaging system 1400 in a second embodiment of the present invention. The integrated circuit packaging system 1400 can include the integrated circuit packaging system 100 of FIG. 1 incorporating solder balls 1402 attached to the contact layer 226 on the base 222 of the terminals 206.

Figure 15:
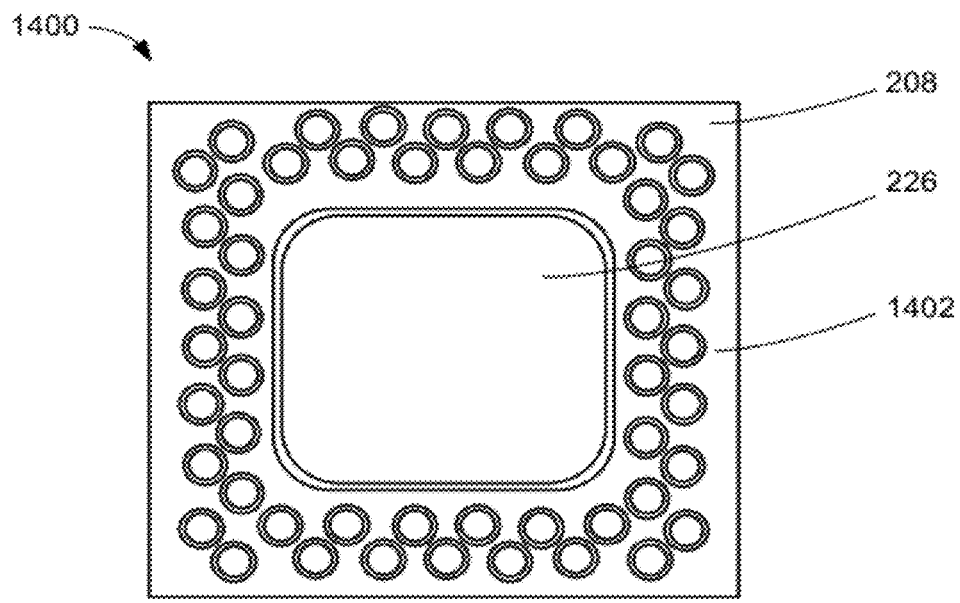
FIG. 15 is a bottom view of the integrated circuit packaging system of FIG. 14.

Referring now to FIG. 15, therein is shown a bottom view of the integrated circuit packaging system 1400 of FIG. 14. The integrated circuit packaging system 1400 can include the contact layer 226 over the dielectric material 208. Also shown are the solder balls 1402 having a staggered pattern to increase the contact area and decrease the possibility of shorting connections.

Figure 16:
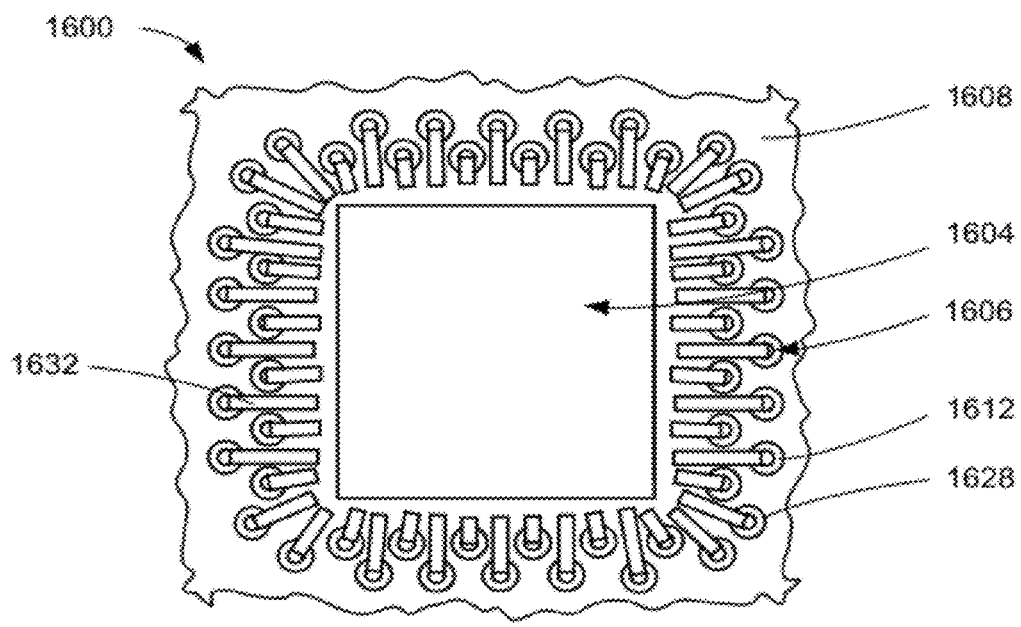
FIG. 16 is a top view of a leadframe assembly for use in an embodiment of the present invention.

Referring now to FIG. 16, therein is shown a top view of a leadframe assembly 1600 for use in an embodiment of the present invention. The leadframe assembly 1600 can include a die pad 1604 and terminals 1606 exposed from a dielectric material 1608. The die pad 1604 is shown fully exposed from the dielectric material 1608 and electrically isolated from the terminals 1606 and in direct contact with the dielectric material 1608.

The dielectric material 1608 is depicted exposing a plateau 1612 of the terminals 1606 with gaps 1628. Within the gaps 1628 and on the plateau 1612 are traces 1632. The traces 1632 extend from the terminals 1606 toward the die pad 1604 and terminate at a non-uniform distance from the die pad 1604, which has been discovered to provide beneficial increases in the trace 1632 density.

Figure 17:
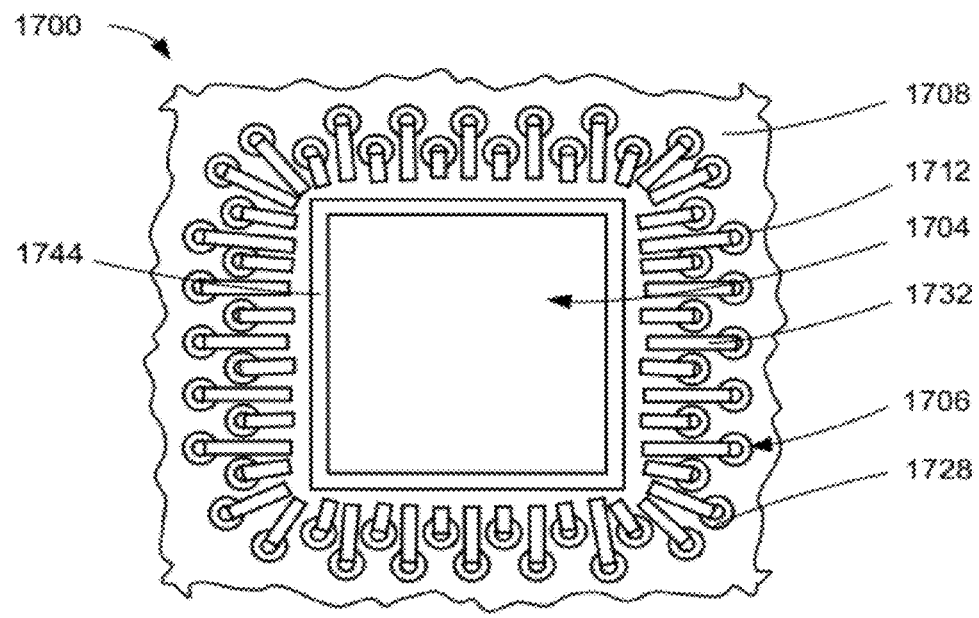
FIG. 17 is a top view of a leadframe assembly for use in an embodiment of the present invention.

Referring now to FIG. 17, therein is shown a top view of a leadframe assembly 1700 for use in an embodiment of the present invention. The leadframe assembly 1700 can include a die pad 1704 and terminals 1706 exposed from a dielectric material 1708. The die pad 1704 is shown fully exposed from the dielectric material 1708 and electrically isolated from the terminals 1706.

The dielectric material 1708 is depicted exposing a plateau 1712 of the terminals 1706 with gaps 1728. Within the gaps 1728 and on the plateau 1712 are traces 1732. The traces 1732 extend from the terminals 1706 toward the die pad 1704 and terminate at a non-uniform distance from the die pad 1704, which has been discovered to provide beneficial increases in the trace 1732 density.

Bordering the die pad 1704 is a perimeter trace 1744. The perimeter trace 1744 is defined as a trace that is parallels a perimeter of the die pad 1704. The die pad 1704 is shown in direct electrical contact with the perimeter trace 1744. The perimeter trace 1744 follows the perimeter of the die pad 1704 in an unbroken pattern and can provide a consolidated contact point for power or ground signals.

Figure 18:
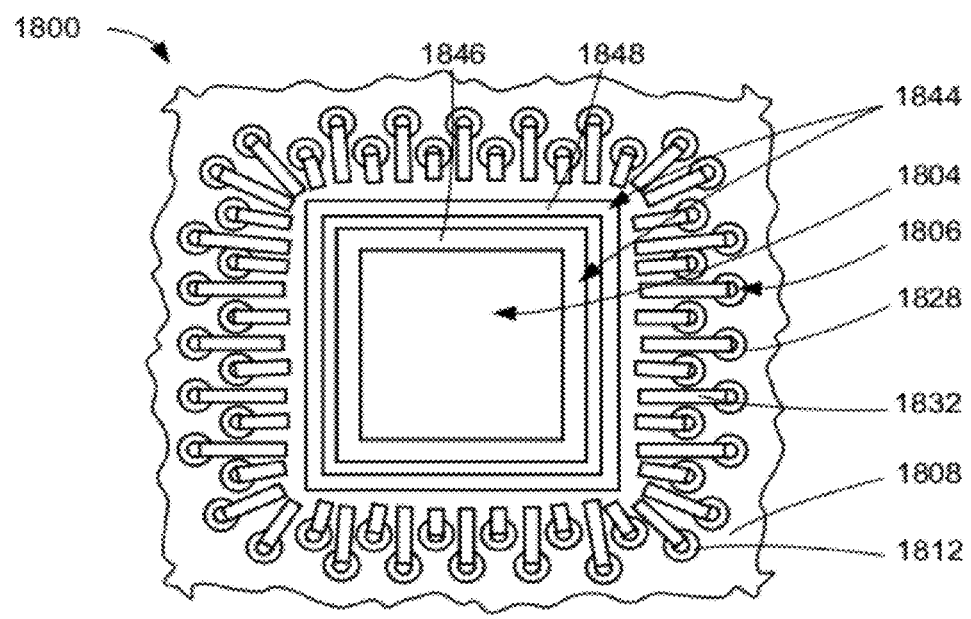
FIG. 18 is a top view of a leadframe assembly for use in an embodiment of the present invention.

Referring now to FIG. 18, therein is shown a top view of a leadframe assembly 1800 for use in an embodiment of the present invention. The leadframe assembly 1800 can include a die pad 1804 and terminals 1806 exposed from a dielectric material 1808. The die pad 1804 is shown fully exposed from the dielectric material 1808 and electrically isolated from the terminals 1806.

The dielectric material 1808 is depicted exposing a plateau 1812 of the terminals 1806 with gaps 1828. Within the gaps 1828 and on the plateau 1812 are traces 1832. The traces 1832 extend from the terminals 1806 toward the die pad 1804 and terminate at a non-uniform distance from the die pad 1804, which has been discovered to provide beneficial increases in the trace 1832 density.

Bordering the die pad 1804 are perimeter traces 1844. The perimeter traces 1844 are defined as traces that parallel a perimeter of the die pad 1804. The die pad 1804 is shown in direct electrical contact with a first perimeter trace 1846. The first perimeter trace 1846 follows the perimeter of the die pad 1804 in an unbroken pattern and can provide a consolidated contact point for power or ground signals.

A second perimeter trace 1848 is shown paralleling the first perimeter trace 1846 in an unbroken pattern. The first perimeter trace 1846 and the second perimeter trace 1848 are physically and electrically isolated by the dielectric material 1808 therebetween. The second perimeter trace 1848 is further shown isolated from the traces 1832 by the dielectric material 1808 therebetween.

Figure 19:
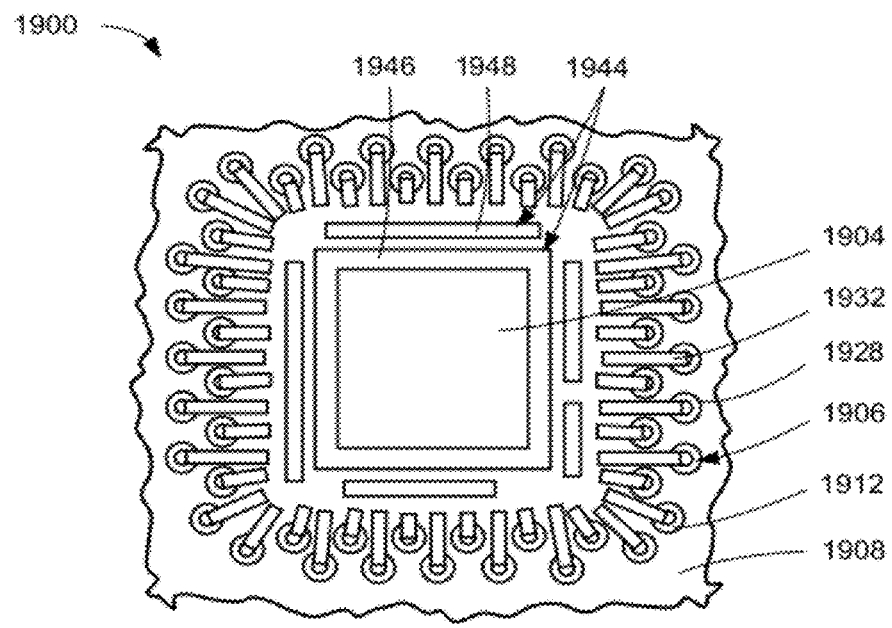
FIG. 19 is a top view of a leadframe assembly for use in an embodiment of the present invention.

Referring now to FIG. 19, therein is shown a top view of a leadframe assembly 1900 for use in an embodiment of the present invention. The leadframe assembly 1900 can include a die pad 1904 and terminals 1906 exposed from a dielectric material 1908. The die pad 1904 is shown exposed from the dielectric material 1908 and electrically isolated from the terminals 1906.

The dielectric material 1908 is depicted exposing a plateau 1912 of the terminals 1906 with gaps 1928. Within the gaps 1928 and on the plateau 1912 are traces 1932. The traces 1932 extend from the terminals 1906 toward the die pad 1904 and terminate at a non-uniform distance from the die pad 1904, which has been discovered to provide beneficial increases in the trace 1932 density.

Bordering the die pad 1904 are perimeter traces 1944. The perimeter traces 1944 are defined as traces that parallel a perimeter of the die pad 1904. The die pad 1904 is shown in direct electrical contact with a first perimeter trace 1946. The first perimeter trace 1946 follows the perimeter of the die pad 1904 in an unbroken pattern and can provide a consolidated contact point for power or ground signals.

A second perimeter trace 1948 is shown paralleling the first perimeter trace 1946 in a broken pattern. The first perimeter trace 1946 and the second perimeter trace 1948 are physically and electrically isolated by the dielectric material 1908 therebetween. The second perimeter trace 1948 is further shown isolated from the traces 1932 by the dielectric material 1908 therebetween. The second perimeter trace 1948 is also shown electrically and physically isolated by the dielectric material 1908 within the broken portions of the broken pattern.

Figure 20:
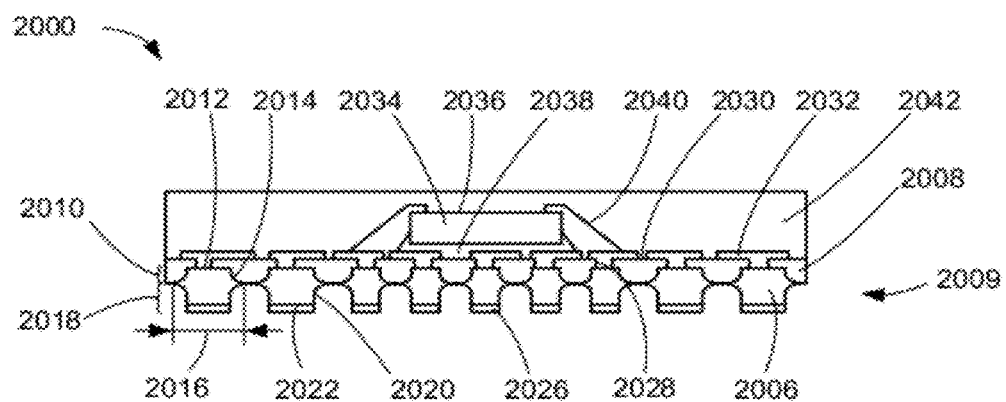
FIG. 20 is a cross-sectional view of an integrated circuit packaging system in a third embodiment of the present invention.

Referring now to FIG. 20, therein is shown a cross-sectional view of an integrated circuit packaging system 2000 in a third embodiment of the present invention. The integrated circuit packaging system 2000 can include terminals 2006. The terminals 2006 are defined as a conductor designed to provide clearance for structures above the terminal and having lateral isolation from direct contact with other terminals; for this reason the terminals 2006 are also known as standoff terminals.

The terminals 2006 are shown having various widths with the terminal around the perimeter region of the integrated circuit packaging system 2000 being wider than the terminals 2006 formed near the center of the integrated circuit packaging system 2000. Although the widths of the terminals 2006 can vary the height of the terminals 2006 is depicted as similar to ensure efficiency of surface mounting capability. Above the terminals 2008 is a dielectric material 2008. The dielectric material 2008 is formed in direct contact with the terminals 2006. The dielectric material 2008 is shown formed between the terminals 2006. The dielectric material 2008 rigidly couples the terminals 2006 in place to form a substrate 2009.

The terminals 2006 are shown having a top 2010. The top 2010 of the terminals 2006 can include a plateau 2012 and also include depressions 2014 extending from the plateau 2012 to a maximum width 2016 of the terminals 2006. The dielectric material 2008 is in direct contact with the top 2010 of the terminals 2006 from the plateau 2012 to the maximum width 2016 of the terminals 2006 and fills in the depressions 2014.

Below the maximum width 2016 of the terminals 2006 is a bottom portion 2018 extending down from the maximum width 2016 of the terminals 2006. The bottom portion 2018 can include a dent 2020 extending down from the maximum width 2016 to a base 2022 of the bottom portion 2018. The base 2022 is depicted as planar or flat. The bottom portion 2018 is depicted as significantly larger, nearly 50% larger or taller than the top 2010. This significant dimension provides extra standoff height and a larger surface area of the terminals 2006 for heat dissipation.

Covering some of the bottom portion 2018 is a contact layer 2026. The contact layer 2026 is defined as a material that can rigidly join to the surface of the terminals 2006 and form electrical connections with other components and capable of being reflowed to form firm connections. The contact layer 2026 can be a solder paste, a layer containing tin or lead, or a conductive high temperature polymer. The contact layer 2026 can cover some of the bottom portion 2018 of the terminals 2006 with an even conformal layer with a uniform cross-section.

It has been discovered that the contact layer 2026 formed on the base 2022 increases solder coverage. Increasing solder coverage with the terminals 2006 increases board level reliability and performance. The contact layer 2026 of the present invention further can be formed by a printing process thereby increasing manufacturing precision without additional costs.

The top 2010 of the terminals 2006 are shown having the dielectric material 2008 formed thereon. The dielectric material 2008 can include gaps 2028 on the top 2010 that expose portions of the plateau 2012 from between the dielectric material 2008. The gaps 2028 are defined as a gap or absence of the dielectric material 2008 that exposes portions of the plateau 2012 from between the dielectric material 2008. The dielectric material 2008 can be designed to support the terminals 2008 during process and to increase structural rigidity in the integrated circuit packaging system 2000. The dielectric material 2008 is designed to increase reliability and structural rigidity in the form of the dielectric material 2008 in the depressions 2014 and having smaller gaps 2028 on the plateau 2012.

On an upper surface 2030 of the dielectric material 2008 are traces 2032. The traces 2032 are formed within the gaps 2028 to electrically connect to and directly contact the plateau 2012 of the terminals 2006 exposed by the gaps 2028 between the dielectric material 2008. The traces 2032 are defined as conductive elements designed to redistribute electrical signals. The traces 2032 are designed to redistribute electrical signals in that they are generally electrically isolated, not excessively large to reduce the introduction of parasitic inductance and do not cover the entire upper surface 2030 of the dielectric material 2008.

It has been discovered that the traces 2032 of the present invention when coupled with the terminals 2006 and formed on the dielectric material 2008 enable efficient high thermal performance of the substrate 2009. The combination of the traces 2032, the dielectric material 2008, and the terminals 2006 has been discovered to have improved thermal and electrical properties when combined and utilized in the described fashion. Improving the integrated circuit packaging systems 2000 thermal performance increases the opportunity to utilize the present invention in multiple areas of high stress and high temperature applications.

Above the traces 2032 is an integrated circuit 2034 depicted as a wire-bonded die having an active side 2036 facing away from the traces 2032. The wire-bonded die 2034 is attached to the traces 2032 and the dielectric material 2008 with an adhesive 2038.

The active side 2036 of the integrated circuit 2034 is electrically connected to the traces 2032 with interconnects 2040 depicted as bond wires. The bond wires 2040 are shown in direct contact with the traces 2032 at various points along the trace 2032. The bond wires 2040 can be connected over the gaps 2028, along the trace near the integrated circuit 2034, spaced at an optimal distance there between, or on a portion of the trace 2032 beyond the gaps 2028 and away from the integrated circuit 2034.

It has been discovered that the traces 2032 provide improved electrical performance by allowing the utilization of shorter bond wires 2040. This improvement is found because the width of the traces 2032 is larger than a width of the interconnects 2040 thus inducing less electrical resistance and inductance thereby increasing high frequency performance. Further, utilizing the traces 2032 along with the terminals 2006 of the present invention decreases the length of the interconnects 2040 required for effective signal propagation to external devices and systems. Decreasing the length of the interconnects 2040 decreases manufacturing costs by reducing the amount of costly material used, like gold, in the process of wire bonding the integrated circuit 2034.

Around the integrated circuit 2034 the interconnects 2040 and the traces 2032 is an encapsulation 2042. The encapsulation 2042 can be glob top, film assist molding, or other encasement structure.

It has been discovered that utilizing the traces 2032 of the present invention in conjunction with the interconnects 2040 and the encapsulation 2042 decreases production costs and complexity by decreasing bond wire 2040 span. It has also been discovered that utilizing the traces 2032 of the present invention in conjunction with the interconnects 2040 and the encapsulation 2042 decreases production costs and complexity by providing a well laid out system for electrically connecting the integrated circuit 2034 to the terminals 2006 without requiring the interconnects 2040 to cross one another. Since the complexity of the bond wire 2040 configuration is substantially decreased a less expensive non-compression molding can be employed.

The wire-bonded die 2034 can optionally be connected to the terminals 2006 directly with the interconnects 2040 having the interconnects 2040 in direct contact with the terminals 2006 and isolated from the traces 2032. The wire-bonded die 2034 can further employ a hybrid approach allowing for some connections to the terminals 2006 to be direct and others to be made through the traces 2032.

Multiple layers of the traces 2032 and the dielectric material 2008 can be formed to enable signal routing with many more connection points. The traces 2032 can be fused together to enable power, ground, or signals to be routed to multiple terminals 2006 or multiple bond wires 2040. The terminals 2006 are depicted in a multi row configuration designed to efficiently utilize the full space below the integrated circuit packaging system 2000 size and enables yet shorter bond wires 2040.

Figure 21:
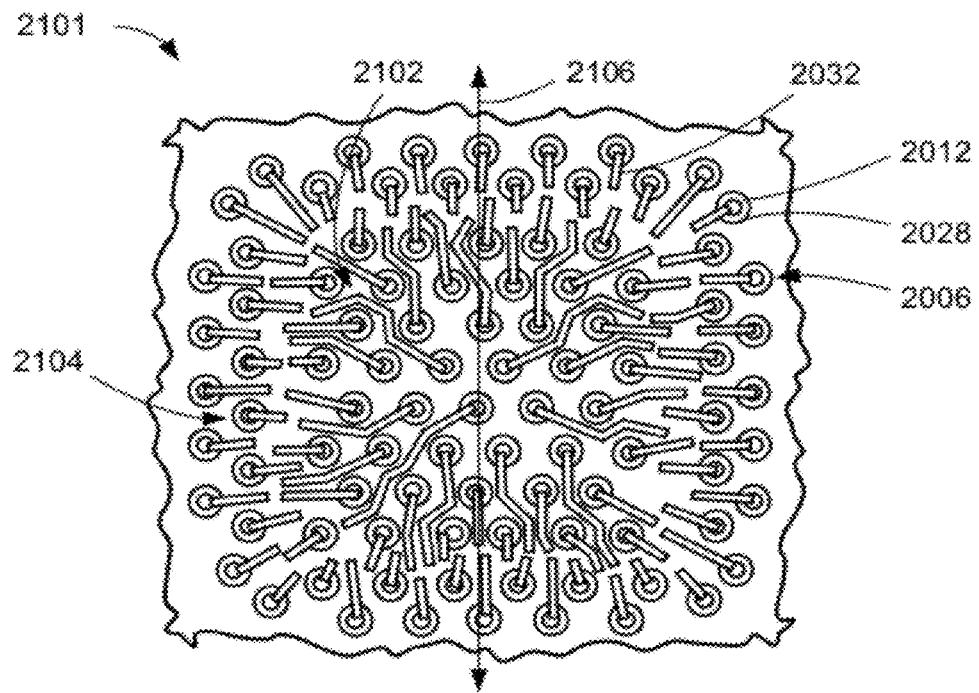
FIG. 21 is a top view of a leadframe assembly for manufacture of the integrated circuit packaging system of FIG. 20 after a trace formation phase of manufacture.

Referring now to FIG. 21, therein is shown a top view of a leadframe assembly 2101 for manufacture of the integrated circuit packaging system 2000 of FIG. 20 after a trace formation phase of manufacture. The leadframe assembly 2101 can include the traces 2032 formed on the plateau 2012 of the terminals 2006 exposed from the gaps 2028. The traces 2032 are shown generally as formed on the terminals 2006 near a center 2102 or formed on the terminals 2006 near a perimeter region 2104.

The traces 2032 formed on the terminals 2006 near the center 2102 are shown extending from the terminals 2006 toward the perimeter region 2104. On the other hand, the traces 2032 formed on the terminals 2006 near the perimeter region 2104 are shown extending from the terminals 2006 toward the center 2102.

The traces 2032 extend from the terminals 2006 and terminate at a non-uniform distance from the terminals 2006, which has been discovered to provide beneficial increases in the trace 2032 density. The terminals 2006 are also depicted as alternating or staggered in a single direction 2106.

Figure 22:
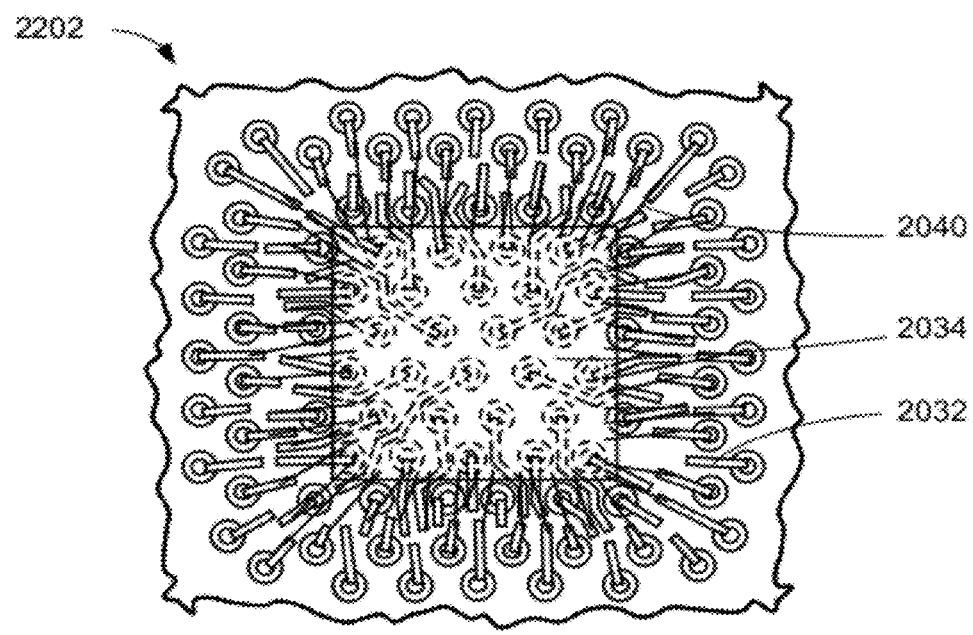
FIG. 22 is a top view of a structure of after a wire bond phase of manufacture.

Referring now to FIG. 22, therein is shown a top view of a structure 2202 after a wire bond phase of manufacture. The structure 2202 can include the integrated circuit 2034 connected to the traces 2032 with the interconnects 2040. The traces 2032 are designed to provide the optimal distance between the interconnects 2040 providing a simpler bond wire 2040 layout and to conserve the amount of material used during the wire bond phase of manufacture to reduce production costs.

Figure 23:
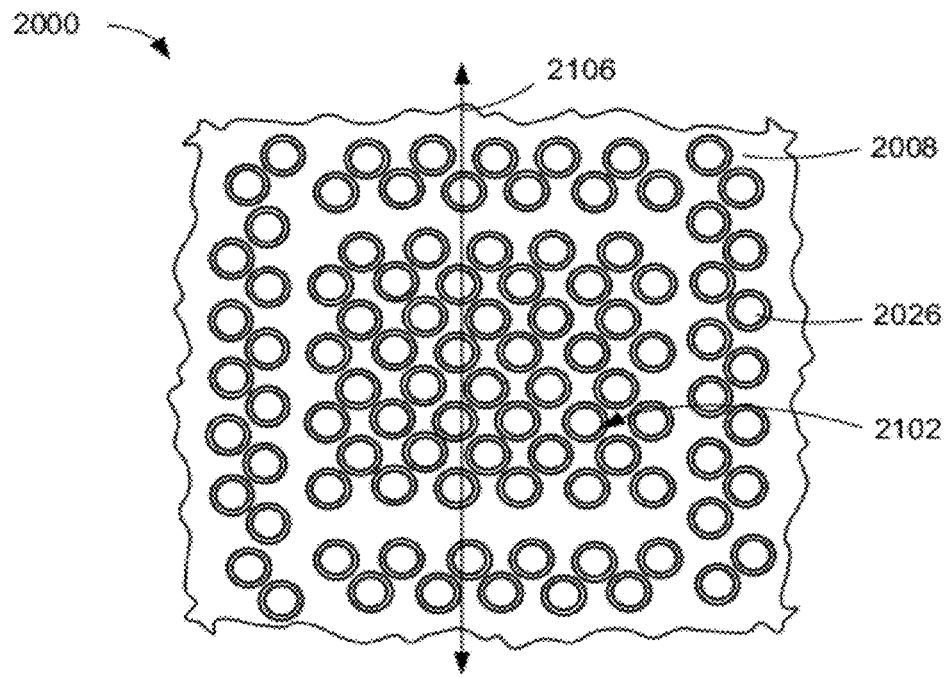
FIG. 23 is a bottom view of the integrated circuit packaging system of FIG. 20 after an etch phase of manufacture.

Referring now to FIG. 23, therein is shown a bottom view of the integrated circuit packaging system 2000 of FIG. 20 after an etch phase of manufacture. The integrated circuit packaging system 2000 can include the contact layer 2026 over the dielectric material 2008. The contact layer 2026 near the center 2102 is shown alternating or staggered in a single direction 2106 to increase the contact area and decrease the possibility of shorting connections.

Figure 24:
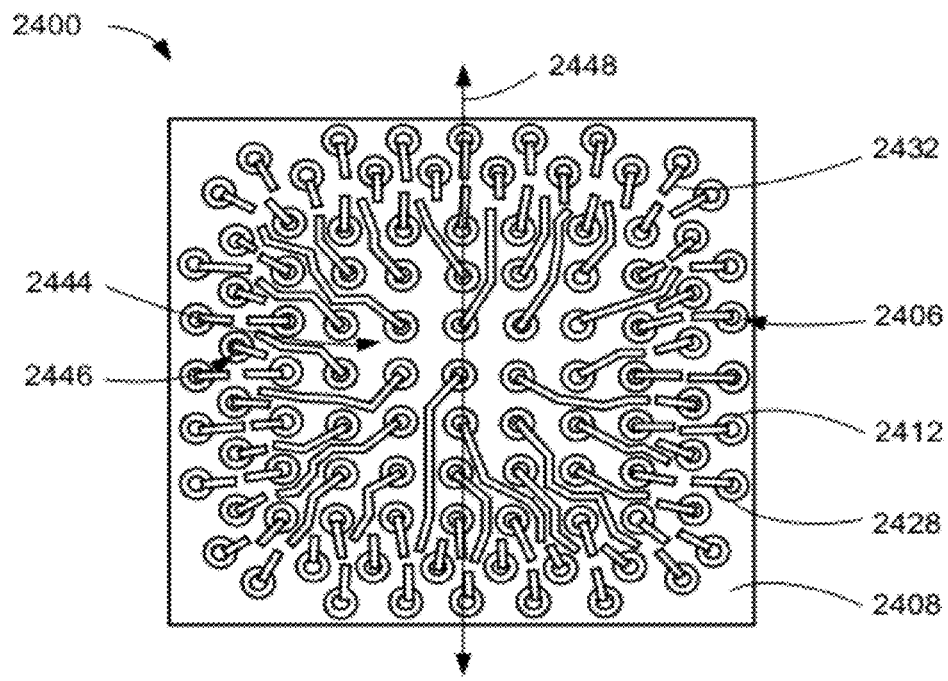
FIG. 24 is a top view of a structure for use in an embodiment of the present invention.

Referring now to FIG. 24, therein is shown a top view of a structure 2400 for use in an embodiment of the present invention. The structure 2400 can include terminals 2406 exposed from a dielectric material 2408. The dielectric material 2408 is depicted exposing a plateau 2412 of the terminals 2406 with gaps 2428. Within the gaps 2428 and on the plateau 2412 are traces 2432.

The traces 2432 are shown generally as formed on the terminals 2406 near a center 2444 or formed on the terminals 2406 near a perimeter region 2446. The traces 2432 formed on the terminals 2406 near the center 2444 are shown extending from the terminals 2406 toward the perimeter region 2446. On the other hand, the traces 2432 formed on the terminals 2406 near the perimeter region 2446 are shown extending from the terminals 2406 toward the center 2444.

The traces 2432 extend from the terminals 2406 and terminate at a non-uniform distance from the terminals 2406, which has been discovered to provide beneficial increases in the trace 2432 density. The terminals 2406 are also depicted as aligned in a single direction 2448.

Figure 25:
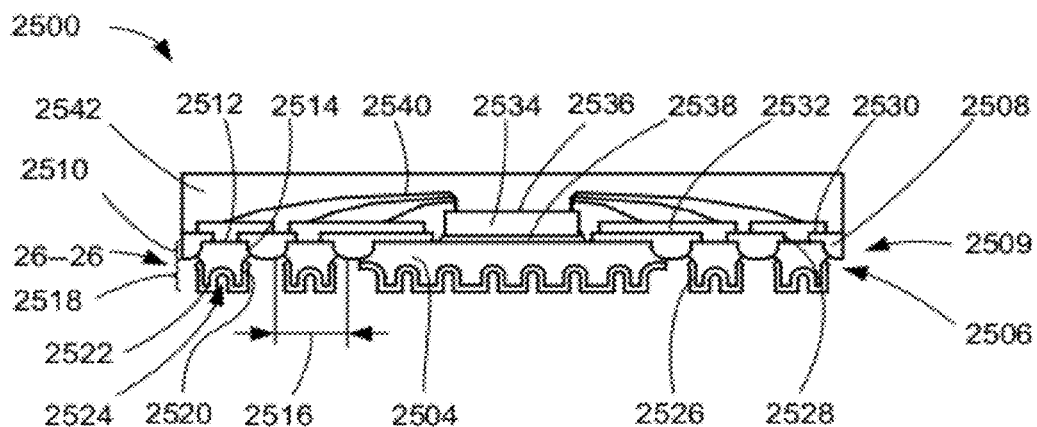
FIG. 25 is a cross-sectional view of an integrated circuit packaging system in a fourth embodiment of the present invention.

Referring now to FIG. 25, therein is shown a cross-sectional view of an integrated circuit packaging system 2500 in a fourth embodiment of the present invention. The integrated circuit packaging system 2500 can include a die pad 2504 and terminals 2506. The terminals 2506 are defined as a conductor designed to provide clearance for structures above the terminal and having lateral isolation from direct contact with other terminals; for this reason the terminals 2506 are also known as standoff terminals.

Above the terminals 2506 is a dielectric material 2508. The dielectric material 2508 is deposited in direct contact with the die pad 2504 and the terminals 2506. The dielectric material 2508 is shown formed between the terminals 2506. The dielectric material 2508 is further shown formed between the terminals 2506 and the die pad 2504. The dielectric material 2508 rigidly couples the terminals 2506 and the die pad 2504 in place to form a substrate 2509.

The terminals 2506 are shown having a top 2510. The top 2510 of the terminals 2506 can include a plateau 2512 and also include depressions 2514 extending from the plateau 2512 to a maximum width 2516 of the terminals 2506. The dielectric material 2508 is in direct contact with the top 2510 of the terminals 2506 from the plateau 2512 to the maximum width 2516 of the terminals 2506 and fills in the depressions 2514.

Below the maximum width 2516 of the terminals 2506 is a bottom portion 2518 extending down from the maximum width 2516 of the terminals 2506. The bottom portion 2518 can include a dent 2520 extending down from the maximum width 2516 to a base 2522 of the bottom portion 2518. The base 2522 is depicted as planar or flat. In the bottom portion 2518 and centered within the base 2522 are dimpled surfaced surfaces 2524.

The dimpled surfaces 2524 are also shown formed in the die pad 2504. The dimpled surfaces 2524 can be rounded as shown in the dimpled surfaces 2524 of the terminals 2506 or can be cornered as shown in the dimpled surfaces 2524 of the die pad 2504. Covering some of the bottom portion 2518 is a contact layer 2526. The contact layer 2526 is defined as a material that can rigidly join to the surface of the terminals 2506 and form electrical connections with other components and capable of being reflowed to form firm connections. The contact layer 2526 can be a solder paste, a layer containing tin or lead, or a conductive high temperature polymer. The contact layer 2526 can cover some of the bottom portion 2518 of the terminals 2506 with an even conformal layer with a uniform cross-section.

The contact layer 2526 is shown covering the bottom portion 2518 surface of the terminals 2506 with an even and conformal film along the dent 2520 on the base 2522 and within the dimpled surfaces 2524. The contact layer 2526 is further depicted covering the underside of the die pad 2504 and forming a film within the dimpled surfaces 2524 of the die pad 2504.

It has been discovered that the contact layer 2526 formed on side surfaces like the dent 2520 and within the dimpled surfaces 2524 increase solder coverage. Increasing solder coverage with the terminals 2506 and the die pad 2504 increases board level reliability and performance. The contact layer 2526 of the present invention further can be formed by a printing process thereby increasing manufacturing precision without additional costs.

The top 2510 of the terminals 2506 are shown having the dielectric material 2508 formed thereon. The dielectric material 2508 can include gaps 2528 on the top 2510 that expose portions of the plateau 2512 from between the dielectric material 2508. The gaps 2528 are defined as a gap or absence of the dielectric material 2508 that exposes portions of the plateau 2512 from between the dielectric material 2508. The dielectric material 2508 can be designed to support the terminals 2506 during process and to increase structural rigidity in the integrated circuit packaging system 2500. The dielectric material 2508 is designed to increase reliability and structural rigidity in the form of the dielectric material 2508 filling the depressions 2514 and having smaller gaps 2528 on the plateau 2512.

On an upper surface 2530 of the dielectric material 2508 are traces 2532. The traces 2532 are formed within the gaps 2528 to electrically connect to and directly contact the plateau 2512 of the terminals 2506 exposed by the gaps 2528 between the dielectric material 2508. The traces 2532 are defined as conductive elements designed to redistribute electrical signals. The traces 2532 are designed to redistribute electrical signals in that they are generally electrically isolated, not excessively large to reduce the introduction of parasitic inductance and do not cover the entire upper surface 2530 of the dielectric material 2508.

It has been discovered that the traces 2532 of the present invention when coupled with the terminals 2506 and formed on the dielectric material 2508 enable efficient high thermal performance of the substrate 2509. The combination of the traces 2532, the dielectric material 2508, and the terminals 2506 has been discovered to have improved thermal and electrical properties when combined and utilized in the described fashion. Improving the integrated circuit packaging systems 2500 thermal performance increases the opportunity to utilize the present invention in multiple areas of high stress and high temperature applications.

Above the die pad 2504 is an integrated circuit 2534 depicted as a wire-bonded die having an active side 2536 facing away from the die pad 2504. The wire-bonded die 2534 is attached to the die pad 2504 with an adhesive 2538.

It has been discovered that the die pad 2504 provides structural stability and decreased risk of delamination from the integrated circuit 2534. The structural support provided by the die pad 2504 has been discovered to increase reliability and performance of the integrated circuit packaging system 2500.

The active side 2536 of the integrated circuit 2534 is electrically connected to the traces 2532 with interconnects 2540 depicted as bond wires. The bond wires 2540 are shown in direct contact with the traces 2532 at various points along the trace 2532. The bond wires 2540 can be connected over the gaps 2528, along the trace near the integrated circuit 2534, spaced at an optimal distance there between, or on a portion of the trace 2532 beyond the gaps 2528 and away from the integrated circuit 2534.

It has been discovered that the traces 2532 provide improved electrical performance by allowing the utilization of shorter bond wires 2540. This improvement is found because the width of the traces 2532 is larger than a width of the interconnects 2540 thus inducing less electrical resistance and inductance thereby increasing high frequency performance. Further, utilizing the traces 2532 along with the terminals 2506 of the present invention decreases the length of the interconnects 2540 required for effective signal propagation to external devices and systems. Decreasing the length of the interconnects 2540 decreases manufacturing costs by reducing the amount of costly material used, like gold, in the process of wire bonding the integrated circuit 2534.

Around the integrated circuit 2534 the interconnects 2540 and the traces 2532 is an encapsulation 2542. The encapsulation 2542 can be glob top, film assist molding, or other encasement structure.

It has been discovered that utilizing the traces 2532 of the present invention in conjunction with the interconnects 2540 and the encapsulation 2542 decreases production costs and complexity by decreasing bond wire 2540 span. It has also been discovered that utilizing the traces 2532 of the present invention in conjunction with the interconnects 2540 and the encapsulation 2542 decreases production costs and complexity by providing a well laid out system for electrically connecting the integrated circuit 2534 to the terminals 2506 without requiring the interconnects 2540 to cross one another. Since the complexity of the bond wire 2540 configuration is substantially decreased a less expensive non-compression molding can be employed.

The wire-bonded die 2534 can optionally be connected to the terminals 2506 directly with the interconnects 2540 having the interconnects 2540 in direct contact with the terminals 2506 and isolated from the traces 2532. The wire-bonded die 2534 can further employ a hybrid approach allowing for some connections to the terminals 2506 to be direct and others to be made through the traces 2532.

Multiple layers of the traces 2532 and the dielectric material 2508 can be formed to enable signal routing with many more connection points. The traces 2532 can be fused together to enable power, ground, or signals to be routed to multiple terminals 2506 or multiple bond wires 2540. The terminals 2506 are depicted in a multi row configuration designed to efficiently utilize the full space below the integrated circuit packaging system 2500 size and enables yet shorter bond wires 2540.

Figure 26:
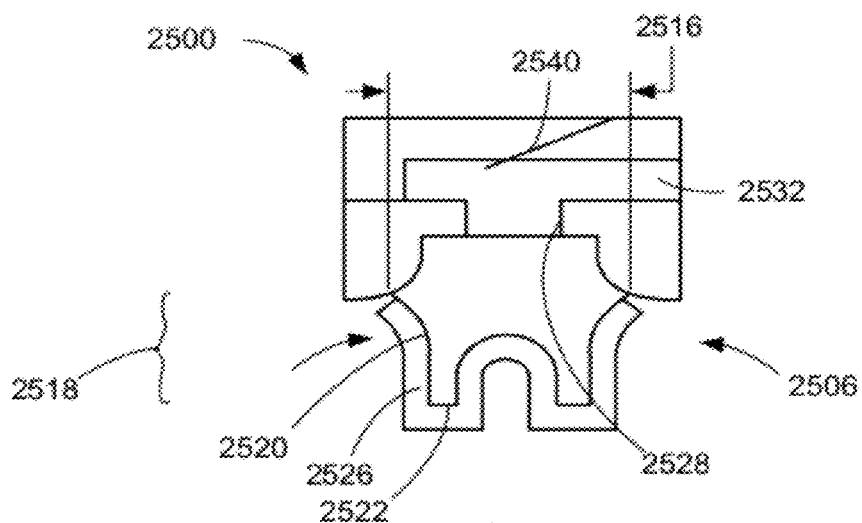
FIG. 26 is a magnified cross-sectional view of region 26-26 of FIG. 25.

Referring now to FIG. 26, therein is shown a magnified cross-sectional view of region 26-26 of FIG. 25. The integrated circuit packaging system 2500 can include the bottom portion 2518 of the terminals 2506 with a conformal coating or layer of the contact layer 2526 thereon. The contact layer 2526 is depicted covering portions of the dent 2520 near the base 2522 but other portions of the dent 2520 near the maximum width 2516 of the terminals 2506 is not covered by the contact layer 2526 but is exposed.

The bond wires 2540 is shown connected to the traces 2532 and formed within the traces 2532. The traces 2532 are further shown formed within the gaps 2528 and filling the entire volume of the gaps 2528.

Figure 27:
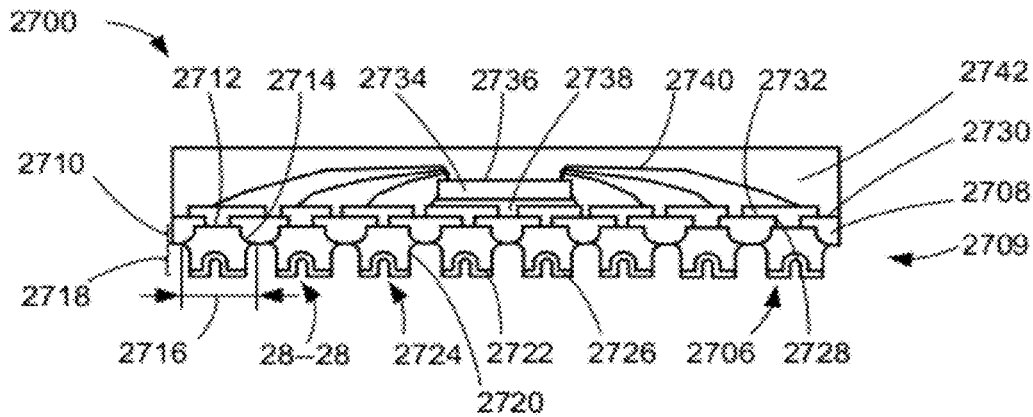
FIG. 27 is a cross-sectional view of an integrated circuit packaging system in a fifth embodiment of the present invention.

Referring now to FIG. 27, therein is shown a cross-sectional view of an integrated circuit packaging system 2700 in a fifth embodiment of the present invention. The integrated circuit packaging system 2700 can include terminals 2706. The terminals 2706 are defined as a conductor designed to provide clearance for structures above the terminal and having lateral isolation from direct contact with other terminals; for this reason the terminals 2706 are also known as standoff terminals.

Above the terminals 2706 is a dielectric material 2708. The dielectric material 2708 is formed in direct contact with the terminals 2706. The dielectric material 2708 is shown formed between the terminals 2706. The dielectric material 2708 rigidly couples the terminals 2706 in place to form a substrate 2709.

The terminals 2706 are shown having a top 2710. The top 2710 of the terminals 2706 can include a plateau 2712 and also include depressions 2714 extending from the plateau 2712 to a maximum width 2716 of the terminals 2706. The dielectric material 2708 is in direct contact with the top 2710 of the terminals 2706 from the plateau 2712 to the maximum width 2716 of the terminals 2706 and fills in the depressions 2714.

Below the maximum width 2716 of the terminals 2706 is a bottom portion 2718 extending down from the maximum width 2716 of the terminals 2706. The bottom portion 2718 can include a dent 2720 extending down from the maximum width 2716 to a base 2722 of the bottom portion 2718. The base 2722 is depicted as planar or flat. In the bottom portion 2718 and centered within the base 2722 are dimpled surfaces 2724.

The dimpled surfaces 2724 can be rounded as shown in the dimpled surfaces 2724 of the terminals 2706. Covering some of the bottom portion 2718 is a contact layer 2726. The contact layer 2726 is defined as a material that can rigidly join to the surface of the terminals 2706 and form electrical connections with other components and capable of being reflowed to form firm connections. The contact layer 2726 can be a solder paste, a layer containing tin or lead, or a conductive high temperature polymer. The contact layer 2726 can cover some of the bottom portion 2718 of the terminals 2706 with an even conformal layer with a uniform cross-section. The contact layer 2726 is shown covering the bottom portion 2718 surface of the terminals 2706 with an even and conformal film along the base 2722 and within the dimpled surfaces 2724.

It has been discovered that the contact layer 2726 formed on side surfaces within the dimpled surfaces 2724 increase solder coverage. Increasing solder coverage with the terminals 2706 increases board level reliability and performance. The contact layer 2726 of the present invention further can be formed by a printing process thereby increasing manufacturing precision without additional costs.

The top 2710 of the terminals 2706 are shown having the dielectric material 2708 formed thereon. The dielectric material 2708 can include gaps 2728 on the top 2710 that expose portions of the plateau 2712 from between the dielectric material 2708. The gaps 2728 are defined as a gap or absence of the dielectric material 2708 that exposes portions of the plateau 2712 from between the dielectric material 2708. The dielectric material 2708 can be designed to support the terminals 2706 during process and to increase structural rigidity in the integrated circuit packaging system 2700. The dielectric material 2708 is designed to increase reliability and structural rigidity in the form of the dielectric material 2708 filling the depressions 2714 and having smaller gaps 2728 on the plateau 2712.

On an upper surface 2730 of the dielectric material 2708 are traces 2732. The traces 2732 are formed within the gaps 2728 to electrically connect to and directly contact the plateau 2712 of the terminals 2706 exposed by the gaps 2728 between the dielectric material 2708. The traces 2732 are defined as conductive elements designed to redistribute electrical signals. The traces 2732 are designed to redistribute electrical signals in that they are generally electrically isolated, not excessively large to reduce the introduction of parasitic inductance and do not cover the entire upper surface 2730 of the dielectric material 2708.

It has been discovered that the traces 2732 of the present invention when coupled with the terminals 2706 and formed on the dielectric material 2708 enable efficient high thermal performance of the substrate 2709. The combination of the traces 2732, the dielectric material 2708, and the terminals 2706 has been discovered to have improved thermal and electrical properties when combined and utilized in the described fashion. Improving the integrated circuit packaging systems 2700 thermal performance increases the opportunity to utilize the present invention in multiple areas of high stress and high temperature applications.

Above the traces 2732 is an integrated circuit 2734 depicted as a wire-bonded die having an active side 2736 facing away from the traces 2732. The wire-bonded die 2734 is attached to the traces 2732 and the dielectric material 2708 with an adhesive 2738.

The active side 2736 of the integrated circuit 2734 is electrically connected to the traces 2732 with interconnects 2740 depicted as bond wires. The bond wires 2740 are shown in direct contact with the traces 2732 at various points along the trace 2732. The bond wires 2740 can be connected over the gaps 2728, along the trace near the integrated circuit 2734, spaced at an optimal distance there between, or on a portion of the trace 2732 beyond the gaps 2728 and away from the integrated circuit 2734.

It has been discovered that the traces 2732 provide improved electrical performance by allowing the utilization of shorter bond wires 2740. This improvement is found because the width of the traces 2732 is larger than a width of the interconnects 2740 thus inducing less electrical resistance and inductance thereby increasing high frequency performance. Further, utilizing the traces 2732 along with the terminals 2706 of the present invention decreases the length of the interconnects 2740 required for effective signal propagation to external devices and systems. Decreasing the length of the interconnects 2740 decreases manufacturing costs by reducing the amount of costly material used, like gold, in the process of wire bonding the integrated circuit 2734.

Around the integrated circuit 2734 the interconnects 2740 and the traces 2732 is an encapsulation 2742. The encapsulation 2742 can be glob top, film assist molding, or other encasement structure.

It has been discovered that utilizing the traces 2732 of the present invention in conjunction with the interconnects 2740 and the encapsulation 2742 decreases production costs and complexity by decreasing bond wire 2740 span. It has also been discovered that utilizing the traces 2732 of the present invention in conjunction with the interconnects 2740 and the encapsulation 2742 decreases production costs and complexity by providing a well laid out system for electrically connecting the integrated circuit 2734 to the terminals 2706 without requiring the interconnects 2740 to cross one another. Since the complexity of the bond wire 2740 configuration is substantially decreased a less expensive non-compression molding can be employed.

The wire-bonded die 2734 can optionally be connected to the terminals 2706 directly with the interconnects 2740 having the interconnects 2740 in direct contact with the terminals 2706 and isolated from the traces 2732. The wire-bonded die 2734 can further employ a hybrid approach allowing for some connections to the terminals 2706 to be direct and others to be made through the traces 2732.

Multiple layers of the traces 2732 and the dielectric material 2708 can be formed to enable signal routing with many more connection points. The traces 2732 can be fused together to enable power, ground, or signals to be routed to multiple terminals 2706 or multiple bond wires 2740. The terminals 2706 are depicted in a multi row configuration designed to efficiently utilize the full space below the integrated circuit packaging system 2700 size and enables yet shorter bond wires 2740.

Figure 28:
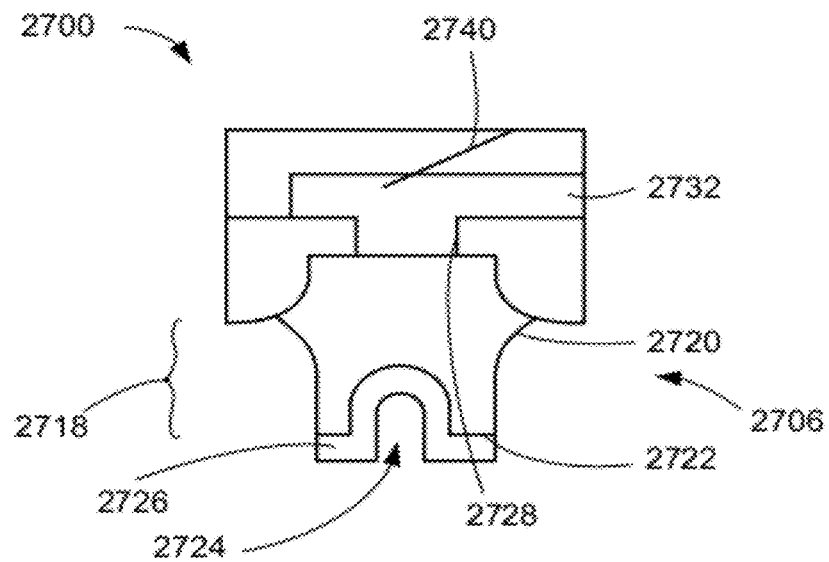
FIG. 28 is a magnified cross-sectional view of region 28-28 of FIG. 27.

Referring now to FIG. 28, therein is shown a magnified cross-sectional view of region 28-28 of FIG. 27. The integrated circuit packaging system 2700 can include the bottom portion 2718 of the terminals 2706 with a conformal coating or layer of the contact layer 2726 thereon. The contact layer 2726 is depicted not covering any portion of the dent 2720 but covering the base 2722 and the dimpled surfaces 2724.

The bond wires 2740 is shown connected to the traces 2732 and formed within the traces 2732. The traces 2732 are further shown formed within the gaps 2728 and filling the entire volume of the gaps 2728.

Figure 29:
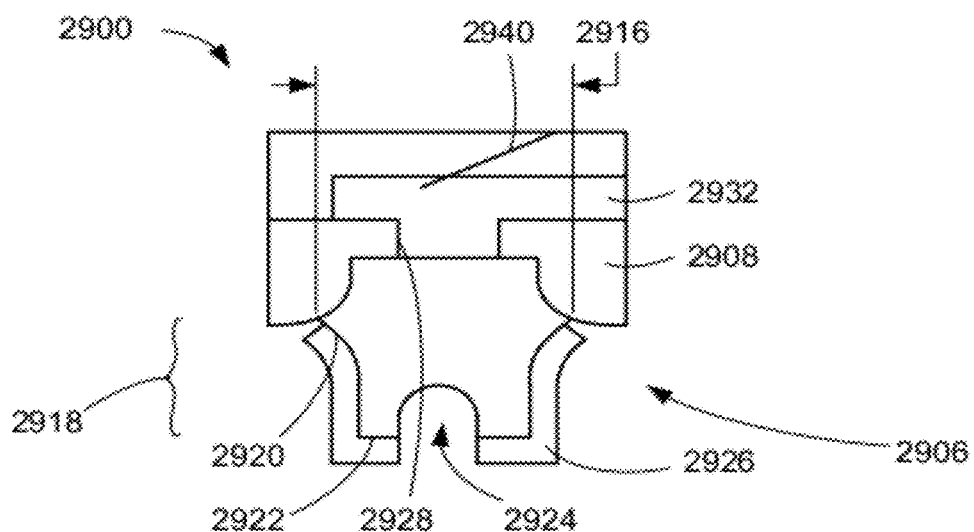
FIG. 29 is a terminal assembly for use in an embodiment of the present invention.

Referring now to FIG. 29, therein is shown a terminal assembly 2900 for use in an embodiment of the present invention. The terminal assembly 2900 can include terminals 2906 in direct contact with a dielectric material 2908. The terminals 2906 further have a maximum width 2916 and a bottom portion 2918 below the maximum width 2916.

The bottom portion 2918 has a dent 2920 extending down from the maximum width 2916 to a base 2922. Centered within the base 2922 are dimpled surfaces 2924. The bottom portion 2918 of the terminals 2906 are coated with a conformal coating or layer of a contact layer 2926 thereon. The contact layer 2926 is depicted covering portions of the dent 2920 near the base 2922 but other portions of the dent 2920 near the maximum width 2916 of the terminals 2906 is not covered by the contact layer 2926 but is exposed.

The contact layer 2926 is further shown covering the base 2922 but is not in contact or covering the dimpled surfaces 2924. Above the terminals 2906 the dielectric material 2908 can include gaps 2928 formed therein and exposing the terminals 2906. Within the gaps 2928 and in direct contact with the terminals 2906 are traces 2932. The traces 2932 are shown formed within the gaps 2928 and filling the entire volume of the gaps 2928. Bond wires 2940 are connected to the traces 2932 and formed within the traces 2932.

Figure 30:
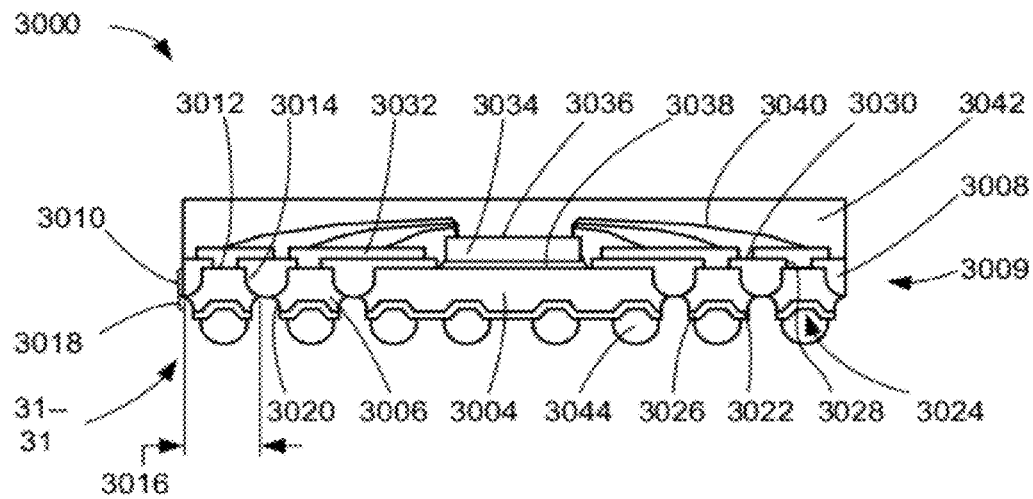
FIG. 30 is a cross-sectional view of an integrated circuit packaging system in a sixth embodiment of the present invention.

Referring now to FIG. 30, therein is shown a cross-sectional view of an integrated circuit packaging system 3000 in a sixth embodiment of the present invention. The integrated circuit packaging system 3000 can include a die pad 3004 and terminals 3006. The terminals 3006 are defined as a conductor designed to provide clearance for structures above the terminal and having lateral isolation from direct contact with other terminals; for this reason the terminals 3006 are also known as standoff terminals.

Above the terminals 3006 is a dielectric material 3008. The dielectric material 3008 is deposited in direct contact with the die pad 3004 and the terminals 3006. The dielectric material 3008 is shown formed between the terminals 3006. The dielectric material 3008 is further shown formed between the terminals 3006 and the die pad 3004. The dielectric material 3008 rigidly couples the terminals 3006 and the die pad 3004 in place to form a substrate 3009.

The terminals 3006 are shown having a top 3010. The top 3010 of the terminals 3006 can include a plateau 3012 and also include depressions 3014 extending from the plateau 3012 to a maximum width 3016 of the terminals 3006. The dielectric material 3008 is in direct contact with the top 3010 of the terminals 3006 from the plateau 3012 to the maximum width 3016 of the terminals 3006 and fills in the depressions 3014.

Below the maximum width 3016 of the terminals 3006 is a bottom portion 3018 extending down from the maximum width 3016 of the terminals 3006. The bottom portion 3018 can include a dent 3020 extending down from the maximum width 3016 to a base 3022 of the bottom portion 3018. The base 3022 is depicted as planar or flat. In the bottom portion 3018 and centered within the base 3022 are dimpled surfaces 3024. The bottom portion 3018 is depicted as slightly smaller or shorter than the top 3010 providing increased standoff distance and clearance.

The dimpled surfaces 3024 are also shown formed in the die pad 3004. The dimpled surfaces 3024 can be cornered as shown in the dimpled surfaces 3024 of the die pad 3004 and the terminals 3006. Covering some of the bottom portion 3018 is a contact layer 3026. The contact layer 3026 is defined as a material that can rigidly join to the surface of the terminals 3006 and form electrical connections with other components and capable of being reflowed to form firm connections. The contact layer 3026 can be a solder paste, a layer containing tin or lead, or a conductive high temperature polymer. The contact layer 3026 can cover some of the bottom portion 3018 of the terminals 3006 with an even conformal layer with a uniform cross-section.

The contact layer 3026 is shown covering the bottom portion 3018 surface of the terminals 3006 with an even and conformal film along the base 3022 and within the dimpled surfaces 3024. The contact layer 3026 is further depicted covering the underside of the die pad 3004 and forming a film within the dimpled surfaces 3024 of the die pad 3004.

It has been discovered that the contact layer 3026 formed on side surfaces like the dent 3020 and within the dimpled surfaces 3024 increase solder coverage. Increasing solder coverage with the terminals 3006 and the die pad 3004 increases board level reliability and performance. The contact layer 3026 of the present invention further can be formed by a printing process thereby increasing manufacturing precision without additional costs.

The top 3010 of the terminals 3006 are shown having the dielectric material 3008 formed thereon. The dielectric material 3008 can include gaps 3028 on the top 3010 that expose portions of the plateau 3012 from between the dielectric material 3008. The gaps 3028 are defined as a gap or absence of the dielectric material 3008 that exposes portions of the plateau 3012 from between the dielectric material 3008. The dielectric material 3008 can be designed to support the terminals 3006 during process and to increase structural rigidity in the integrated circuit packaging system 3000. The dielectric material 3008 is designed to increase reliability and structural rigidity in the form of the dielectric material 3008 filling the depressions 3014 and having smaller gaps 3028 on the plateau 3012.

On an upper surface 3030 of the dielectric material 3008 are traces 3032. The traces 3032 are formed within the gaps 3028 to electrically connect to and directly contact the plateau 3012 of the terminals 3006 exposed by the gaps 3028 between the dielectric material 3008. The traces 3032 are defined as conductive elements designed to redistribute electrical signals. The traces 3032 are designed to redistribute electrical signals in that they are generally electrically isolated, not excessively large to reduce the introduction of parasitic inductance and do not cover the entire upper surface 3030 of the dielectric material 3008.

It has been discovered that the traces 3032 of the present invention when coupled with the terminals 3006 and formed on the dielectric material 3008 enable efficient high thermal performance of the substrate 3009. The combination of the traces 3032, the dielectric material 3008, and the terminals 3006 has been discovered to have improved thermal and electrical properties when combined and utilized in the described fashion. Improving the integrated circuit packaging systems 3000 thermal performance increases the opportunity to utilize the present invention in multiple areas of high stress and high temperature applications.

Above the die pad 3004 is an integrated circuit 3034 depicted as a wire-bonded die having an active side 3036 facing away from the die pad 3004. The wire-bonded die 3034 is attached to the die pad 3004 with an adhesive 3038.

It has been discovered that the die pad 3004 provides structural stability and decreased risk of delamination from the integrated circuit 3034. The structural support provided by the die pad 3004 has been discovered to increase reliability and performance of the integrated circuit packaging system 3000.

The active side 3036 of the integrated circuit 3034 is electrically connected to the traces 3032 with interconnects 3040 depicted as bond wires. The bond wires 3040 are shown in direct contact with the traces 3032 at various points along the trace 3032. The bond wires 3040 can be connected over the gaps 3028, along the trace near the integrated circuit 3034, spaced at an optimal distance there between, or on a portion of the trace 3032 beyond the gaps 3028 and away from the integrated circuit 3034.

It has been discovered that the traces 3032 provide improved electrical performance by allowing the utilization of shorter bond wires 3040. This improvement is found because the width of the traces 3032 is larger than a width of the interconnects 3040 thus inducing less electrical resistance and inductance thereby increasing high frequency performance. Further, utilizing the traces 3032 along with the terminals 3006 of the present invention decreases the length of the interconnects 3040 required for effective signal propagation to external devices and systems. Decreasing the length of the interconnects 3040 decreases manufacturing costs by reducing the amount of costly material used, like gold, in the process of wire bonding the integrated circuit 3034.

Around the integrated circuit 3034 the interconnects 3040 and the traces 3032 is an encapsulation 3042. The encapsulation 3042 can be glob top, film assist molding, or other encasement structure. On the dimpled surfaces 3024 are solder ball drops 3044. Employing solder ball drops 3044 has been discovered to increase uniform ball co-planarity and enhance board level reliability.

It has been discovered that utilizing the traces 3032 of the present invention in conjunction with the interconnects 3040 and the encapsulation 3042 decreases production costs and complexity by decreasing bond wire 3040 span. It has also been discovered that utilizing the traces 3032 of the present invention in conjunction with the interconnects 3040 and the encapsulation 3042 decreases production costs and complexity by providing a well laid out system for electrically connecting the integrated circuit 3034 to the terminals 3006 without requiring the interconnects 3040 to cross one another. Since the complexity of the bond wire 3040 configuration is substantially decreased a less expensive non-compression molding can be employed.

The wire-bonded die 3034 can optionally be connected to the terminals 3006 directly with the interconnects 3040 having the interconnects 3040 in direct contact with the terminals 3006 and isolated from the traces 3032. The wire-bonded die 3034 can further employ a hybrid approach allowing for some connections to the terminals 3006 to be direct and others to be made through the traces 3032.

Multiple layers of the traces 3032 and the dielectric material 3008 can be formed to enable signal routing with many more connection points. The traces 3032 can be fused together to enable power, ground, or signals to be routed to multiple terminals 3006 or multiple bond wires 3040. The terminals 3006 are depicted in a multi row configuration designed to efficiently utilize the full space below the integrated circuit packaging system 3000 size and enables yet shorter bond wires 3040.

Figure 31:
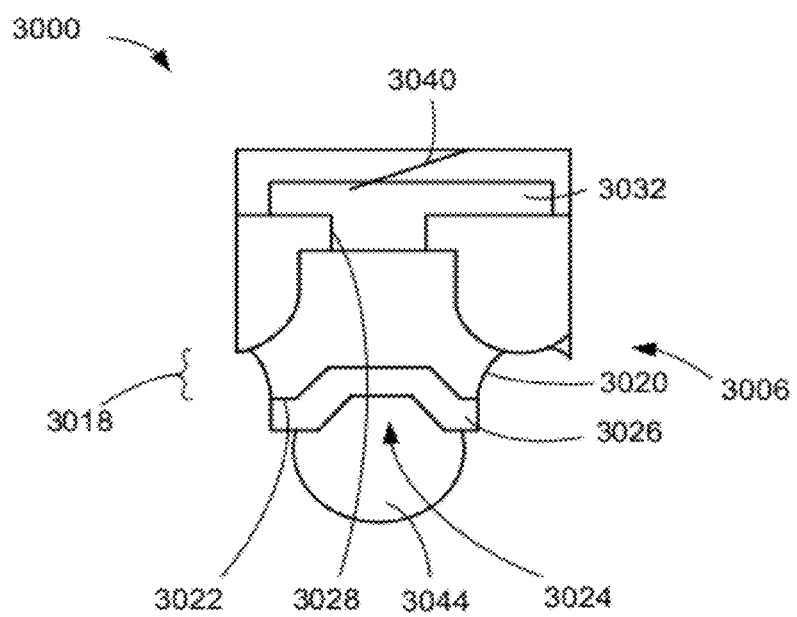
FIG. 31 is a magnified cross-sectional view of region 31-31 of FIG. 30.

Referring now to FIG. 31, therein is shown a magnified cross-sectional view of region 31-31 of FIG. 30. The integrated circuit packaging system 3000 can include the bottom portion 3018 of the terminals 3006 with a conformal coating or layer of the contact layer 3026 thereon. The contact layer 3026 is depicted not covering any portion of the dent 3020 but covering the base 3022 and the dimpled surfaces 3024.

The bond wires 3040 is shown connected to the traces 3032 and formed within the traces 3032. The traces 3032 are further shown formed within the gaps 3028 and filling the entire volume of the gaps 3028. Within the dimpled surfaces 3024 and below the contact layer 3026 the solder ball drops 3044 are formed.

Figure 32:
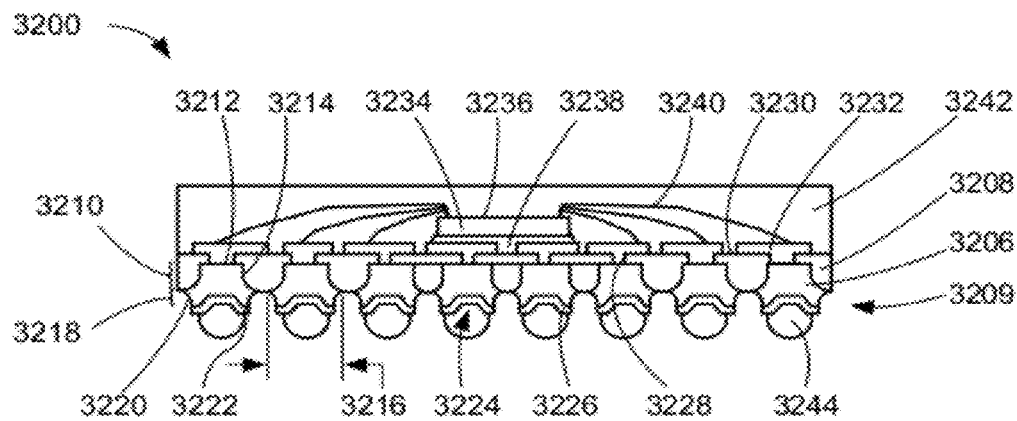
FIG. 32 is a cross-sectional view of an integrated circuit packaging system in a seventh embodiment of the present invention.

Referring now to FIG. 32, therein is shown a cross-sectional view of an integrated circuit packaging system 3200 in a seventh embodiment of the present invention. The integrated circuit packaging system 3200 can include terminals 3206. The terminals 3206 are defined as a conductor designed to provide clearance for structures above the terminal and having lateral isolation from direct contact with other terminals; for this reason the terminals 3206 are also known as standoff terminals.

Above the terminals 3206 is a dielectric material 3208. The dielectric material 3208 is formed in direct contact with the terminals 3206. The dielectric material 3208 is shown formed between the terminals 3206. The dielectric material 3208 rigidly couples the terminals 3206 in place to form a substrate 3209.

The terminals 3206 are shown having a top 3210. The top 3210 of the terminals 3206 can include a plateau 3212 and also include depressions 3214 extending from the plateau 3212 to a maximum width 3216 of the terminals 3206. The dielectric material 3208 is in direct contact with the top 3210 of the terminals 3206 from the plateau 3212 to the maximum width 3216 of the terminals 3206 and fills in the depressions 3214.

Below the maximum width 3216 of the terminals 3206 is a bottom portion 3218 extending down from the maximum width 3216 of the terminals 3206. The bottom portion 3218 can include a dent 3220 extending down from the maximum width 3216 to a base 3222 of the bottom portion 3218. The base 3222 is depicted as planar or flat. In the bottom portion 3218 and centered within the base 3222 are dimpled surfaces 3224.

The dimpled surfaces 3224 can be rounded as shown in the dimpled surfaces 3224 of the terminals 3206. Covering some of the bottom portion 3218 is a contact layer 3226. The contact layer 3226 is defined as a material that can rigidly join to the surface of the terminals 3206 and form electrical connections with other components and capable of being reflowed to form firm connections. The contact layer 3226 can be a solder paste, a layer containing tin or lead, or a conductive high temperature polymer. The contact layer 3226 can cover some of the bottom portion 3218 of the terminals 3206 with an even conformal layer with a uniform cross-section. The contact layer 3226 is shown covering the bottom portion 3218 surface of the terminals 3206 with an even and conformal film along the base 3222 and within the dimpled surfaces 3224.

It has been discovered that the contact layer 3226 formed on side surfaces within the dimpled surfaces 3224 increase solder coverage. Increasing solder coverage with the terminals 3206 increases board level reliability and performance. The contact layer 3226 of the present invention further can be formed by a printing process thereby increasing manufacturing precision without additional costs.

The top 3210 of the terminals 3206 are shown having the dielectric material 3208 formed thereon. The dielectric material 3208 can include gaps 3228 on the top 3210 that expose portions of the plateau 3212 from between the dielectric material 3208. The gaps 3228 are defined as a gap or absence of the dielectric material 3208 that exposes portions of the plateau 3212 from between the dielectric material 3208. The dielectric material 3208 can be designed to support the terminals 3206 during process and to increase structural rigidity in the integrated circuit packaging system 3200. The dielectric material 3208 is designed to increase reliability and structural rigidity in the form of the dielectric material 3208 filling the depressions 3214 and having smaller gaps 3228 on the plateau 3212.

On an upper surface 3230 of the dielectric material 3208 are traces 3232. The traces 3232 are formed within the gaps 3228 to electrically connect to and directly contact the plateau 3212 of the terminals 3206 exposed by the gaps 3228 between the dielectric material 3208. The traces 3232 are defined as conductive elements designed to redistribute electrical signals. The traces 3232 are designed to redistribute electrical signals in that they are generally electrically isolated, not excessively large to reduce the introduction of parasitic inductance and do not cover the entire upper surface 3230 of the dielectric material 3208.

It has been discovered that the traces 3232 of the present invention when coupled with the terminals 3206 and formed on the dielectric material 3208 enable efficient high thermal performance of the substrate 3209. The combination of the traces 3232, the dielectric material 3208, and the terminals 3206 has been discovered to have improved thermal and electrical properties when combined and utilized in the described fashion. Improving the integrated circuit packaging systems 3200 thermal performance increases the opportunity to utilize the present invention in multiple areas of high stress and high temperature applications.

Above the traces 3232 is an integrated circuit 3234 depicted as a wire-bonded die having an active side 3236 facing away from the traces 3232. The wire-bonded die 3234 is attached to the traces 3232 and the dielectric material 3208 with an adhesive 3238. The traces 3232 extend beyond the integrated circuit 3234.

The active side 3236 of the integrated circuit 3234 is electrically connected to the traces 3232 with interconnects 3240 depicted as bond wires. The bond wires 3240 are shown in direct contact with the traces 3232 at various points along the trace 3232. The bond wires 3240 can be connected over the gaps 3228, along the trace near the integrated circuit 3234, spaced at an optimal distance there between, or on a portion of the trace 3232 beyond the gaps 3228 and away from the integrated circuit 3234.

It has been discovered that the traces 3232 provide improved electrical performance by allowing the utilization of shorter bond wires 3240. This improvement is found because the width of the traces 3232 is larger than a width of the interconnects 3240 thus inducing less electrical resistance and inductance thereby increasing high frequency performance. Further, utilizing the traces 3232 along with the terminals 3206 of the present invention decreases the length of the interconnects 3240 required for effective signal propagation to external devices and systems. Decreasing the length of the interconnects 3240 decreases manufacturing costs by reducing the amount of costly material used, like gold, in the process of wire bonding the integrated circuit 3234.

Around the integrated circuit 3234 the interconnects 3240 and the traces 3232 is an encapsulation 3242. The encapsulation 3242 can be glob top, film assist molding, or other encasement structure. On the dimpled surfaces 3224 are solder ball drops 3244. Employing solder ball drops 3244 has been discovered to increase uniform ball co-planarity and enhance board level reliability.

It has been discovered that utilizing the traces 3232 of the present invention in conjunction with the interconnects 3240 and the encapsulation 3242 decreases production costs and complexity by decreasing bond wire 3240 span. It has also been discovered that utilizing the traces 3232 of the present invention in conjunction with the interconnects 3240 and the encapsulation 3242 decreases production costs and complexity by providing a well laid out system for electrically connecting the integrated circuit 3234 to the terminals 3206 without requiring the interconnects 3240 to cross one another. Since the complexity of the bond wire 3240 configuration is substantially decreased a less expensive non-compression molding can be employed.

The wire-bonded die 3234 can optionally be connected to the terminals 3206 directly with the interconnects 3240 having the interconnects 3240 in direct contact with the terminals 3206 and isolated from the traces 3232. The wire-bonded die 3234 can further employ a hybrid approach allowing for some connections to the terminals 3206 to be direct and others to be made through the traces 3232.

Multiple layers of the traces 3232 and the dielectric material 3208 can be formed to enable signal routing with many more connection points. The traces 3232 can be fused together to enable power, ground, or signals to be routed to multiple terminals 3206 or multiple bond wires 3240. The terminals 3206 are depicted in a multi row configuration designed to efficiently utilize the full space below the integrated circuit packaging system 3200 size and enables yet shorter bond wires 3240.

Figure 33:
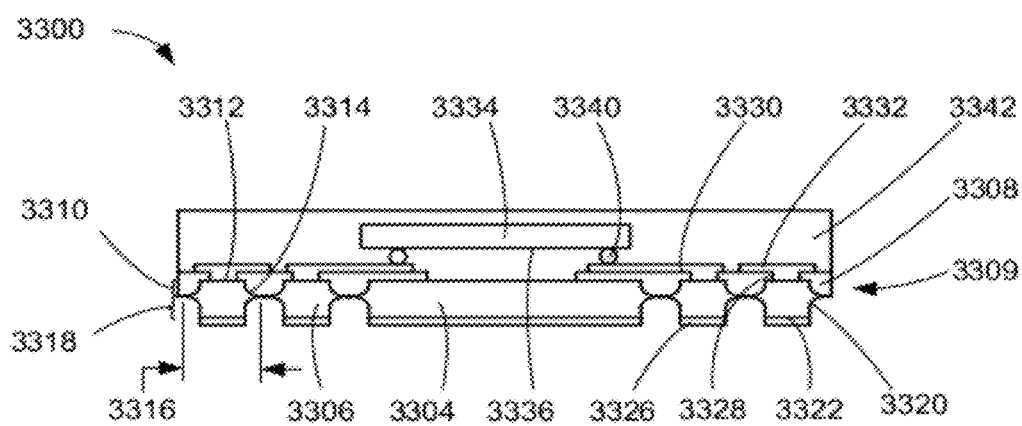
FIG. 33 is a cross-sectional view of an integrated circuit packaging system in an eighth embodiment of the present invention.

Referring now to FIG. 33, therein is shown a cross-sectional view of an integrated circuit packaging system 3300 in an eighth embodiment of the present invention. The integrated circuit packaging system 3300 can include a die pad 3304 and terminals 3306. The terminals 3306 are defined as a conductor designed to provide clearance for structures above the terminal and having lateral isolation from direct contact with other terminals; for this reason the terminals 3306 are also known as standoff terminals.

Above the terminals 3306 is a dielectric material 3308. The dielectric material 3308 is deposited in direct contact with the die pad 3304 and the terminals 3306. The dielectric material 3308 is shown formed between the terminals 3306. The dielectric material 3308 is further shown formed between the terminals 3306 and the die pad 3304. The dielectric material 3308 rigidly couples the terminals 3306 and the die pad 3304 in place to form a substrate 3309.

The terminals 3306 are shown having a top 3310. The top 3310 of the terminals 3306 can include a plateau 3312 and also include depressions 3314 extending from the plateau 3312 to a maximum width 3316 of the terminals 3306. The dielectric material 3308 is in direct contact with the top 3310 of the terminals 3306 from the plateau 3312 to the maximum width 3316 of the terminals 3306 and fills in the depressions 3314.

Below the maximum width 3316 of the terminals 3306 is a bottom portion 3318 extending down from the maximum width 3316 of the terminals 3306. The bottom portion 3318 can include a dent 3320 extending down from the maximum width 3316 to a base 3322 of the bottom portion 3318. The base 3322 is depicted as planar or flat.

Covering some of the bottom portion 3318 is a contact layer 3326. The contact layer 3326 is defined as a material that can rigidly join to the surface of the terminals 3306 and form electrical connections with other components and capable of being reflowed to form firm connections. The contact layer 3326 can be a solder paste, a layer containing tin or lead, or a conductive high temperature polymer. The contact layer 3326 can cover some of the bottom portion 3318 of the terminals 3306 with an even conformal layer with a uniform cross-section.

The contact layer 3326 is shown covering the bottom portion 3318 surface of the terminals 3306 with an even and conformal film along the base 3322. The contact layer 3326 is further depicted covering the underside of the die pad 3304.

It has been discovered that the contact layer 3326 formed on the base 3322 increases solder coverage. Increasing solder coverage with the terminals 3306 and the die pad 3304 increases board level reliability and performance. The contact layer 3326 of the present invention further can be formed by a printing process thereby increasing manufacturing precision without additional costs.

The top 3310 of the terminals 3306 are shown having the dielectric material 3308 formed thereon. The dielectric material 3308 can include gaps 3328 on the top 3310 that expose portions of the plateau 3312 from between the dielectric material 3308. The gaps 3328 are defined as a gap or absence of the dielectric material 3308 that exposes portions of the plateau 3312 from between the dielectric material 3308. The dielectric material 3308 can be designed to support the terminals 3306 during process and to increase structural rigidity in the integrated circuit packaging system 3300. The dielectric material 3308 is designed to increase reliability and structural rigidity in the form of the dielectric material 3308 filling the depressions 3314 and having smaller gaps 3328 on the plateau 3312.

On an upper surface 3330 of the dielectric material 3308 are traces 3332. The traces 3332 are formed within the gaps 3328 to electrically connect to and directly contact the plateau 3312 of the terminals 3306 exposed by the gaps 3328 between the dielectric material 3308. The traces 3332 are defined as conductive elements designed to redistribute electrical signals. The traces 3332 are designed to redistribute electrical signals in that they are generally electrically isolated, not excessively large to reduce the introduction of parasitic inductance and do not cover the entire upper surface 3330 of the dielectric material 3308.

It has been discovered that the traces 3332 of the present invention when coupled with the terminals 3306 and formed on the dielectric material 3308 enable efficient high thermal performance of the substrate 3309. The combination of the traces 3332, the dielectric material 3308, and the terminals 3306 has been discovered to have improved thermal and electrical properties when combined and utilized in the described fashion. Improving the integrated circuit packaging systems 3300 thermal performance increases the opportunity to utilize the present invention in multiple areas of high stress and high temperature applications.

Above the die pad 3304 is an integrated circuit 3334 depicted as a flip-chip die having an active side 3336. The active side 3336 is shown facing toward the die pad 3304.

It has been discovered that the die pad 3304 provides structural stability and decreased risk of warping and ultimately breakage or damage of the integrated circuit 3334. The structural support provided by the die pad 3304 has been discovered to increase reliability and performance of the integrated circuit packaging system 3300.

The active side 3336 of the integrated circuit 3334 is electrically connected to the traces 3332 with interconnects 3340 depicted as solder bumps. The solder bumps 3340 are shown in direct contact with the traces 3332 at various points along the trace 3332. The solder bumps 3340 can be connected over the gaps 3328, along the trace near the integrated circuit 3334, spaced at an optimal distance there between, or on a portion of the trace 3332 beyond the gaps 3328 and away from the integrated circuit 3334. The flip-chip die 3334 is large enough to overhang the traces 3332 and part of the dielectric material 3308.

It has been discovered that the traces 3332 provide improved electrical performance by allowing the utilization of smaller flip-chip dies 3334. This allows for greater process and design flexibility by allowing design flexibility of the traces 3332 to offset the largely fixed size of the integrated circuit 3334.

Around the integrated circuit 3334 the interconnects 3340 and the traces 3332 is an encapsulation 3342. The encapsulation 3342 can be glob top, film assist molding, or other encasement structure.

It has been discovered that utilizing the traces 3332 of the present invention in conjunction with the integrated circuit 3334 and the encapsulation 3342 decreases production costs and complexity by decreasing the size of flip-chip die 3334. Since the size and susceptibility of breakage or damage of the integrated circuit 3334 is substantially decreased a less expensive non-compression molding can be employed.

The flip-chip die 3334 can optionally be connected to the terminals 3306 directly with the interconnects 3340 having the interconnects 3340 in direct contact with the terminals 3306 and isolated from the traces 3332. The flip-chip die 3334 can further employ a hybrid approach allowing for some connections to the terminals 3306 to be direct and others to be made through the traces 3332.

Multiple layers of the traces 3332 and the dielectric material 3308 can be formed to enable signal routing with many more connection points. The traces 3332 can be fused together to enable power, ground, or signals to be routed to multiple terminals 3306 or multiple solder bumps 3340. The terminals 3306 are depicted in a multi row configuration designed to efficiently utilize the full space below the integrated circuit packaging system 3300 size and enables yet smaller flip-chip dies 3334. Wire-bonded die can also be stacked upon the integrated circuit 3334 and connected to the traces 3332 with bond wires to form hybrid flip-chip die and wire-bonded die stacks.

Figure 34:
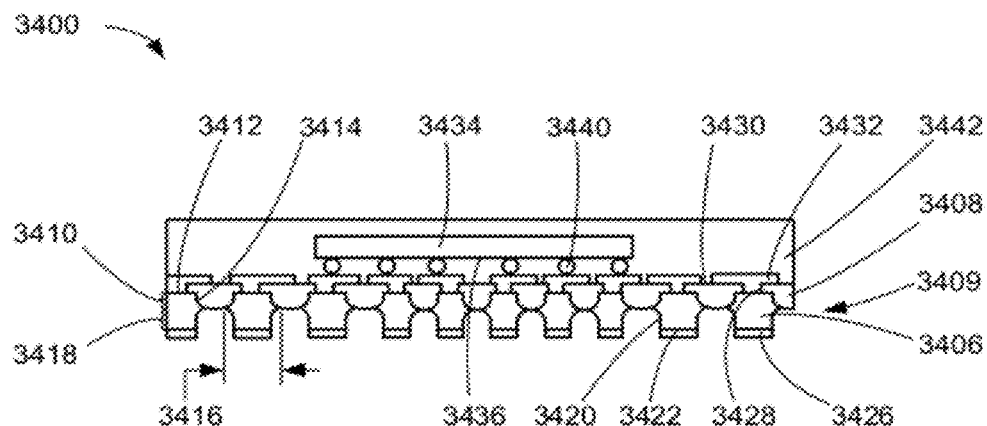
FIG. 34 is a cross-sectional view of an integrated circuit packaging system in a ninth embodiment of the present invention.

Referring now to FIG. 34, therein is shown a cross-sectional view of an integrated circuit packaging system 3400 in a ninth embodiment of the present invention. The integrated circuit packaging system 3400 can include terminals 3406. The terminals 3406 are defined as a conductor designed to provide clearance for structures above the terminal and having lateral isolation from direct contact with other terminals; for this reason the terminals 3406 are also known as standoff terminals.

The terminals 3406 are shown having various widths with the terminal around the perimeter region of the integrated circuit packaging system 3400 being wider than the terminals 3406 formed near the center of the integrated circuit packaging system 3400. Although the widths of the terminals 3406 can vary the height of the terminals 3406 is depicted as similar to ensure efficiency of surface mounting capability. Above the terminals 3406 is a dielectric material 3408. The dielectric material 3408 is formed in direct contact with the terminals 3406. The dielectric material 3408 is shown formed between the terminals 3406. The dielectric material 3408 rigidly couples the terminals 3406 in place to form a substrate 3409.

The terminals 3406 are shown having a top 3410. The top 3410 of the terminals 3406 can include a plateau 3412 and also include depressions 3414 extending from the plateau 3412 to a maximum width 3416 of the terminals 3406. The dielectric material 3408 is in direct contact with the top 3410 of the terminals 3406 from the plateau 3412 to the maximum width 3416 of the terminals 3406 and fills in the depressions 3414.

Below the maximum width 3416 of the terminals 3406 is a bottom portion 3418 extending down from the maximum width 3416 of the terminals 3406. The bottom portion 3418 can include a dent 3420 extending down from the maximum width 3416 to a base 3422 of the bottom portion 3418. The base 3422 is depicted as planar or flat.

Covering some of the bottom portion 3418 is a contact layer 3426. The contact layer 3426 is defined as a material that can rigidly join to the surface of the terminals 3406 and form electrical connections with other components and capable of being reflowed to form firm connections. The contact layer 3426 can be a solder paste, a layer containing tin or lead, or a conductive high temperature polymer. The contact layer 3426 can cover some of the bottom portion 3418 of the terminals 3406 with an even conformal layer with a uniform cross-section.

It has been discovered that the contact layer 3426 formed on the base 3422 increases solder coverage. Increasing solder coverage with the terminals 3406 increases board level reliability and performance. The contact layer 3426 of the present invention further can be formed by a printing process thereby increasing manufacturing precision without additional costs.

The top 3410 of the terminals 3406 are shown having the dielectric material 3408 formed thereon. The dielectric material 3408 can include gaps 3428 on the top 3410 that expose portions of the plateau 3412 from between the dielectric material 3408. The gaps 3428 are defined as a gap or absence of the dielectric material 3408 that exposes portions of the plateau 3412 from between the dielectric material 3408. The dielectric material 3408 can be designed to support the terminals 3406 during process and to increase structural rigidity in the integrated circuit packaging system 3400. The dielectric material 3408 is designed to increase reliability and structural rigidity in the form of the dielectric material 3408 filling the depressions 3414 and having smaller gaps 3428 on the plateau 3412.

On an upper surface 3430 of the dielectric material 3408 are traces 3432. The traces 3432 are formed within the gaps 3428 to electrically connect to and directly contact the plateau 3412 of the terminals 3406 exposed by the gaps 3428 between the dielectric material 3408. The traces 3432 are defined as conductive elements designed to redistribute electrical signals. The traces 3432 are designed to redistribute electrical signals in that they are generally electrically isolated, not excessively large to reduce the introduction of parasitic inductance and do not cover the entire upper surface 3430 of the dielectric material 3408.

It has been discovered that the traces 3432 of the present invention when coupled with the terminals 3406 and formed on the dielectric material 3408 enable efficient high thermal performance of the substrate 3409. The combination of the traces 3432, the dielectric material 3408, and the terminals 3406 has been discovered to have improved thermal and electrical properties when combined and utilized in the described fashion. Improving the integrated circuit packaging systems 3400 thermal performance increases the opportunity to utilize the present invention in multiple areas of high stress and high temperature applications.

Above the terminals 3406 is an integrated circuit 3434 depicted as a flip-chip die having an active side 3436. The active side 3436 is shown facing toward the terminals 3406.

It has been discovered that the terminals 3406 coupled with the dielectric material 3408 provides structural stability and decreased risk of warping and ultimately breakage or damage of the integrated circuit 3434. The structural support provided by the terminals 3406 and the dielectric material 3408 has been discovered to increase reliability and performance of the integrated circuit packaging system 3400.

The active side 3436 of the integrated circuit 3434 is electrically connected to the traces 3432 with interconnects 3440 depicted as solder bumps. The solder bumps 3440 are shown in direct contact with the traces 3432 at various points along the trace 3432. The solder bumps 3440 can be connected over the gaps 3428, along the trace near the integrated circuit 3434, spaced at an optimal distance there between, or on a portion of the trace 3432 beyond the gaps 3428 and away from the integrated circuit 3434. The flip-chip die 3434 is large enough to overhang the traces 3432 and part of the dielectric material 3408.

It has been discovered that the traces 3432 provide improved electrical performance by allowing the utilization of smaller flip-chip dies 3434. This allows for greater process and design flexibility by allowing design flexibility of the traces 3432 to offset the largely fixed size of the integrated circuit 3434.

Around the integrated circuit 3434 the interconnects 3440 and the traces 3432 is an encapsulation 3442. The encapsulation 3442 can be glob top, film assist molding, or other encasement structure.

It has been discovered that utilizing the traces 3432 of the present invention in conjunction with the integrated circuit 3434 and the encapsulation 3442 decreases production costs and complexity by decreasing the size of flip-chip die 3434. Since the size and susceptibility of breakage or damage of the integrated circuit 3434 is substantially decreased a less expensive non-compression molding can be employed.

The flip-chip die 3434 can optionally be connected to the terminals 3406 directly with the interconnects 3440 having the interconnects 3440 in direct contact with the terminals 3406 and isolated from the traces 3432. The flip-chip die 3434 can further employ a hybrid approach allowing for some connections to the terminals 3406 to be direct and others to be made through the traces 3432.

Multiple layers of the traces 3432 and the dielectric material 3408 can be formed to enable signal routing with many more connection points. The traces 3432 can be fused together to enable power, ground, or signals to be routed to multiple terminals 3406 or multiple solder bumps 3440. The terminals 3406 are depicted in a multi row configuration designed to efficiently utilize the full space below the integrated circuit packaging system 3400 size and enables yet smaller flip-chip dies 3434. Wire-bonded die can also be stacked upon the integrated circuit 3434 and connected to the traces 3432 with bond wires to form hybrid flip-chip die and wire-bonded die stacks.

Figure 35:
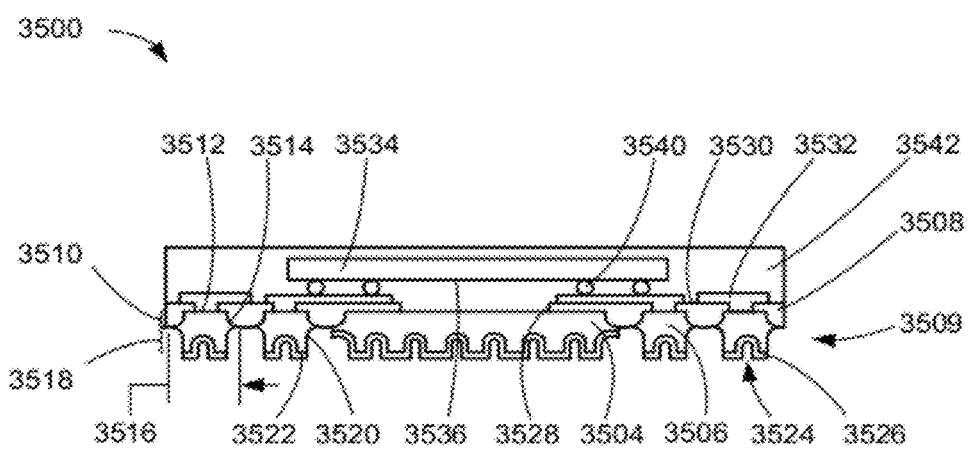
FIG. 35 is a cross-sectional view of an integrated circuit packaging system in a tenth embodiment of the present invention.

Referring now to FIG. 35, therein is shown a cross-sectional view of an integrated circuit packaging system 3500 in a tenth embodiment of the present invention. The integrated circuit packaging system 3500 can include a die pad 3504 and terminals 3506. The terminals 3506 are defined as a conductor designed to provide clearance for structures above the terminal and having lateral isolation from direct contact with other terminals; for this reason the terminals 3506 are also known as standoff terminals.

Above the terminals is a dielectric material 3508. The dielectric material 3508 is deposited in direct contact with the die pad 3504 and the terminals 3506. The dielectric material 3508 is shown formed between the terminals 3506. The dielectric material 3508 is further shown formed between the terminals 3506 and the die pad 3504. The dielectric material 3508 rigidly couples the terminals 3506 and the die pad 3504 in place to form a substrate 3509.

The terminals 3506 are shown having a top 3510. The top 3510 of the terminals 3506 can include a plateau 3512 and also include depressions 3514 extending from the plateau 3512 to a maximum width 3516 of the terminals 3506. The dielectric material 3508 is in direct contact with the top 3510 of the terminals 3506 from the plateau 3512 to the maximum width 3516 of the terminals 3506 and fills in the depressions 3514.

Below the maximum width 3516 of the terminals 3506 is a bottom portion 3518 extending down from the maximum width 3516 of the terminals 3506. The bottom portion 3518 can include a dent 3520 extending down from the maximum width 3516 to a base 3522 of the bottom portion 3518. The base 3522 is depicted as planar or flat. In the bottom portion 3518 and centered within the base 3522 are dimpled surfaces 3524.

The dimpled surfaces 3524 can be rounded as shown in the dimpled surfaces 3524 of the terminals 3506. Covering some of the bottom portion 3518 is a contact layer 3526. The contact layer 3526 is defined as a material that can rigidly join to the surface of the terminals 3506 and form electrical connections with other components and capable of being reflowed to form firm connections. The contact layer 3526 can be a solder paste, a layer containing tin or lead, or a conductive high temperature polymer. The contact layer 3526 can cover some of the bottom portion 3518 of the terminals 3506 with an even conformal layer with a uniform cross-section. The contact layer 3526 is shown covering the bottom portion 3518 surface of the terminals 3506 with an even and conformal film along the base 3522 and within the dimpled surfaces 3524. The contact layer 3526 is further depicted covering the underside of the die pad 3504.

It has been discovered that the contact layer 3526 formed on side surfaces within the dimpled surfaces 3524 increase solder coverage. Increasing solder coverage with the terminals 3506 and the die pad 3504 increases board level reliability and performance. The contact layer 3526 of the present invention further can be formed by a printing process thereby increasing manufacturing precision without additional costs.

The top 3510 of the terminals 3506 are shown having the dielectric material 3508 formed thereon. The dielectric material 3508 can include gaps 3528 on the top 3510 that expose portions of the plateau 3512 from between the dielectric material 3508. The gaps 3528 are defined as a gap or absence of the dielectric material 3508 that exposes portions of the plateau 3512 from between the dielectric material 3508. The dielectric material 3508 can be designed to support the terminals 3506 during process and to increase structural rigidity in the integrated circuit packaging system 3500. The dielectric material 3508 is designed to increase reliability and structural rigidity in the form of the dielectric material 3508 filling the depressions 3514 and having smaller gaps 3528 on the plateau 3512.

On an upper surface 3530 of the dielectric material 3508 are traces 3532. The traces 3532 are formed within the gaps 3528 to electrically connect to and directly contact the plateau 3512 of the terminals 3506 exposed by the gaps 3528 between the dielectric material 3508. The traces 3532 are defined as conductive elements designed to redistribute electrical signals. The traces 3532 are designed to redistribute electrical signals in that they are generally electrically isolated, not excessively large to reduce the introduction of parasitic inductance and do not cover the entire upper surface 3530 of the dielectric material 3508.

It has been discovered that the traces 3532 of the present invention when coupled with the terminals 3506 and formed on the dielectric material 3508 enable efficient high thermal performance of the substrate 3509. The combination of the traces 3532, the dielectric material 3508, and the terminals 3506 has been discovered to have improved thermal and electrical properties when combined and utilized in the described fashion. Improving the integrated circuit packaging systems 3500 thermal performance increases the opportunity to utilize the present invention in multiple areas of high stress and high temperature applications.

Above the die pad 3504 is an integrated circuit 3534 depicted as a flip-chip die having an active side 3536. The active side 3536 is shown facing toward the die pad 3504.

It has been discovered that the die pad 3504 provides structural stability and decreased risk of warping and ultimately breakage or damage of the integrated circuit 3534. The structural support provided by the die pad 3504 has been discovered to increase reliability and performance of the integrated circuit packaging system 3500.

The active side 3536 of the integrated circuit 3534 is electrically connected to the traces 3532 with interconnects 3540 depicted as solder bumps. The solder bumps 3540 are shown in direct contact with the traces 3532 at various points along the trace 3532. The solder bumps 3540 can be connected over the gaps 3528, along the trace near the integrated circuit 3534, spaced at an optimal distance there between, or on a portion of the trace 3532 beyond the gaps 3528 and away from the integrated circuit 3534. The flip-chip die 3534 is large enough to overhang the traces 3532 and part of the dielectric material 3508.

It has been discovered that the traces 3532 provide improved electrical performance by allowing the utilization of smaller flip-chip dies 3534. This allows for greater process and design flexibility by allowing design flexibility of the traces 3532 to offset the largely fixed size of the integrated circuit 3534.

Around the integrated circuit 3534 the interconnects 3540 and the traces 3532 is an encapsulation 3542. The encapsulation 3542 can be glob top, film assist molding, or other encasement structure.

It has been discovered that utilizing the traces 3532 of the present invention in conjunction with the integrated circuit 3534 and the encapsulation 3542 decreases production costs and complexity by decreasing the size of flip-chip die 3534. Since the size and susceptibility of breakage or damage of the integrated circuit 3534 is substantially decreased a less expensive non-compression molding can be employed.

The flip-chip die 3534 can optionally be connected to the terminals 3506 directly with the interconnects 3540 having the interconnects 3540 in direct contact with the terminals 3506 and isolated from the traces 3532. The flip-chip die 3534 can further employ a hybrid approach allowing for some connections to the terminals 3506 to be direct and others to be made through the traces 3532.

Multiple layers of the traces 3532 and the dielectric material 3508 can be formed to enable signal routing with many more connection points. The traces 3532 can be fused together to enable power, ground, or signals to be routed to multiple terminals 3506 or multiple solder bumps 3540. The terminals 3506 are depicted in a multi row configuration designed to efficiently utilize the full space below the integrated circuit packaging system 3500 size and enables yet smaller flip-chip dies 3534. Wire-bonded die can also be stacked upon the integrated circuit 3534 and connected to the traces 3532 with bond wires to form hybrid flip-chip die and wire-bonded die stacks.

Figure 36:
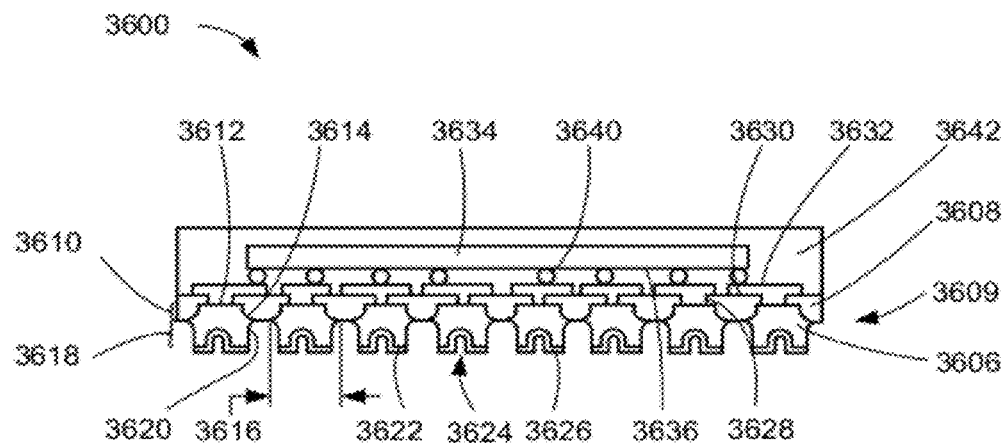
FIG. 36 is a cross-sectional view of an integrated circuit packaging system in an eleventh embodiment of the present invention.

Referring now to FIG. 36, therein is shown a cross-sectional view of an integrated circuit packaging system 3600 in an eleventh embodiment of the present invention. The integrated circuit packaging system 3600 can include terminals 3606. The terminals 3606 are defined as a conductor designed to provide clearance for structures above the terminal and having lateral isolation from direct contact with other terminals; for this reason the terminals 3606 are also known as standoff terminals.

The terminals 3606 are shown having similar widths and heights. Above the terminals 3606 is a dielectric material 3608. The dielectric material 3608 is formed in direct contact with the terminals 3606. The dielectric material 3608 is shown formed between the terminals 3606. The dielectric material 3608 rigidly couples the terminals 3606 in place to form a substrate 3609.

The terminals 3606 are shown having a top 3610. The top 3610 of the terminals 3606 can include a plateau 3612 and also include depressions 3614 extending from the plateau 3612 to a maximum width 3616 of the terminals 3606. The dielectric material 3608 is in direct contact with the top 3610 of the terminals 3606 from the plateau 3612 to the maximum width 3616 of the terminals 3606 and fills in the depressions 3614.

Below the maximum width 3616 of the terminals 3606 is a bottom portion 3618 extending down from the maximum width 3616 of the terminals 3606. The bottom portion 3618 can include a dent 3620 extending down from the maximum width 3616 to a base 3622 of the bottom portion 3618. The base 3622 is depicted as planar or flat. In the bottom portion 3618 and centered within the base 3622 are dimpled surfaces 3624.

The dimpled surfaces 3624 can be rounded as shown in the dimpled surfaces 3624 of the terminals 3606.

Covering some of the bottom portion 3618 is a contact layer 3626. The contact layer 3626 is defined as a material that can rigidly join to the surface of the terminals 3606 and form electrical connections with other components and capable of being reflowed to form firm connections. The contact layer 3626 can be a solder paste, a layer containing tin or lead, or a conductive high temperature polymer. The contact layer 3626 can cover some of the bottom portion 3618 of the terminals 3606 with an even conformal layer with a uniform cross-section.

It has been discovered that the contact layer 3626 formed on side surfaces within the dimpled surfaces 3624 increase solder coverage. Increasing solder coverage with the terminals 3606 increases board level reliability and performance. The contact layer 3626 of the present invention further can be formed by a printing process thereby increasing manufacturing precision without additional costs.

The top 3610 of the terminals 3606 are shown having the dielectric material 3608 formed thereon. The dielectric material 3608 can include gaps 3628 on the top 3610 that expose portions of the plateau 3612 from between the dielectric material 3608. The gaps 3628 are defined as a gap or absence of the dielectric material 3608 that exposes portions of the plateau 3612 from between the dielectric material 3608. The dielectric material 3608 can be designed to support the terminals 3606 during process and to increase structural rigidity in the integrated circuit packaging system 3600. The dielectric material 3608 is designed to increase reliability and structural rigidity in the form of the dielectric material 3608 filling the depressions 3614 and having smaller gaps 3628 on the plateau 3612.

On an upper surface 3630 of the dielectric material 3608 are traces 3632. The traces 3632 are formed within the gaps

3628 to electrically connect to and directly contact the plateau 3612 of the terminals 3606 exposed by the gaps 3628 between the dielectric material 3608. The traces 3632 are defined as conductive elements designed to redistribute electrical signals. The traces 3632 are designed to redistribute electrical signals in that they are generally electrically isolated, not excessively large to reduce the introduction of parasitic inductance and do not cover the entire upper surface 3630 of the dielectric material 3608.

It has been discovered that the traces 3632 of the present invention when coupled with the terminals 3606 and formed on the dielectric material 3608 enable efficient high thermal performance of the substrate 3609. The combination of the traces 3632, the dielectric material 3608, and the terminals 3606 has been discovered to have improved thermal and electrical properties when combined and utilized in the described fashion. Improving the integrated circuit packaging systems 3600 thermal performance increases the opportunity to utilize the present invention in multiple areas of high stress and high temperature applications.

Above the terminals 3606 is an integrated circuit 3634 depicted as a flip-chip die having an active side 3636. The active side 3636 is shown facing toward the terminals 3606.

It has been discovered that the terminals 3606 coupled with the dielectric material 3608 provides structural stability and decreased risk of warping and ultimately breakage or damage of the integrated circuit 3634. The structural support provided by the terminals 3606 and the dielectric material 3608 has been discovered to increase reliability and performance of the integrated circuit packaging system 3600.

The active side 3636 of the integrated circuit 3634 is electrically connected to the traces 3632 with interconnects 3640 depicted as solder bumps. The solder bumps 3640 are shown in direct contact with the traces 3632 at various points along the trace 3632. The solder bumps 3640 can be connected over the gaps 3628, along the trace near the integrated circuit 3634, spaced at an optimal distance there between, or on a portion of the trace 3632 beyond the gaps 3628 and away from the integrated circuit 3634. The flip-chip die 3634 is large enough to overhang the traces 3632 and part of the dielectric material 3608.

It has been discovered that the traces 3632 provide improved electrical performance by allowing the utilization of smaller flip-chip dies 3634. This allows for greater process and design flexibility by allowing design flexibility of the traces 3632 to offset the largely fixed size of the integrated circuit 3634.

Around the integrated circuit 3634 the interconnects 3640 and the traces 3632 is an encapsulation 3642. The encapsulation 3642 can be glob top, film assist molding, or other encasement structure.

It has been discovered that utilizing the traces 3632 of the present invention in conjunction with the integrated circuit 3634 and the encapsulation 3642 decreases production costs and complexity by decreasing the size of flip-chip die 3634. Since the size and susceptibility of breakage or damage of the integrated circuit 3634 is substantially decreased a less expensive non-compression molding can be employed.

The flip-chip die 3634 can optionally be connected to the terminals 3606 directly with the interconnects 3640 having the interconnects 3640 in direct contact with the terminals 3606 and isolated from the traces 3632. The flip-chip die 3634 can further employ a hybrid approach allowing for some connections to the terminals 3606 to be direct and others to be made through the traces 3632.

Multiple layers of the traces 3632 and the dielectric material 3608 can be formed to enable signal routing with many more connection points. The traces 3632 can be fused together to enable power, ground, or signals to be routed to multiple terminals 3606 or multiple solder bumps 3640. The terminals 3606 are depicted in a multi row configuration designed to efficiently utilize the full space below the integrated circuit packaging system 3600 size and enables yet smaller flip-chip dies 3634. Wire-bonded die can also be stacked upon the integrated circuit 3634 and connected to the traces 3632 with bond wires to form hybrid flip-chip die and wire-bonded die stacks.

Figure 37:
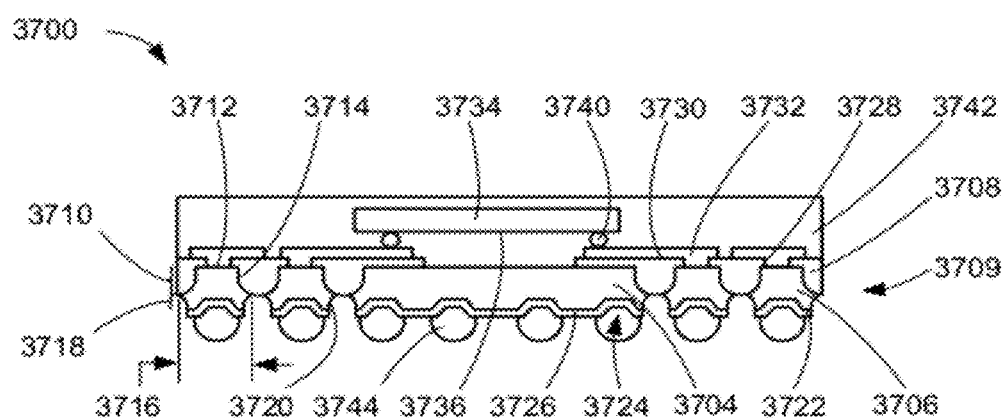
FIG. 37 is a cross-sectional view of an integrated circuit packaging system in a twelfth embodiment of the present invention.

Referring now to FIG. 37, therein is shown a cross-sectional view of an integrated circuit packaging system 3700 in a twelfth embodiment of the present invention. The integrated circuit packaging system 3700 can include a die pad 3704 and terminals 3706. The terminals 3706 are defined as a conductor designed to provide clearance for structures above the terminal and having lateral isolation from direct contact with other terminals; for this reason the terminals 3706 are also known as standoff terminals.

Above the terminals 3706 is a dielectric material 3708. The dielectric material 3708 is deposited in direct contact with the die pad 3704 and the terminals 3706. The dielectric material 3708 is shown formed between the terminals 3706. The dielectric material 3708 is further shown formed between the terminals 3706 and the die pad 3704. The dielectric material 3708 rigidly couples the terminals 3706 and the die pad 3704 in place to form a substrate 3709.

The terminals 3706 are shown having a top 3710. The top 3710 of the terminals 3706 can include a plateau 3712 and also include depressions 3714 extending from the plateau 3712 to a maximum width 3716 of the terminals 3706. The dielectric material 3708 is in direct contact with the top 3710 of the terminals 3706 from the plateau 3712 to the maximum width 3716 of the terminals 3706 and fills in the depressions 3714.

Below the maximum width 3716 of the terminals 3706 is a bottom portion 3718 extending down from the maximum width 3716 of the terminals 3706. The bottom portion 3718 can include a dent 3720 extending down from the maximum width 3716 to a base 3722 of the bottom portion 3718. The base 3722 is depicted as planar or flat. In the bottom portion 3718 and centered within the base 3722 are dimpled surfaces 3724.

The dimpled surfaces 3724 can be rounded as shown in the dimpled surfaces 3724 of the terminals 3706. Covering some of the bottom portion 3718 is a contact layer 3726. The contact layer 3726 is defined as a material that can rigidly join to the surface of the terminals 3706 and form electrical connections with other components and capable of being reflowed to form firm connections. The contact layer 3726 can be a solder paste, a layer containing tin or lead, or a conductive high temperature polymer. The contact layer 3726 can cover some of the bottom portion 3718 of the terminals 3706 with an even conformal layer with a uniform cross-section. The contact layer 3726 is shown covering the bottom portion 3718 surface of the terminals 3706 with an even and conformal film along the base 3722 and within the dimpled surfaces 3724. The contact layer 3726 is further depicted covering the underside of the die pad 3704.

It has been discovered that the contact layer 3726 formed on side surfaces within the dimpled surfaces 3724 increase solder coverage. Increasing solder coverage with the terminals 3706 and the die pad 3704 increases board level reliability and performance. The contact layer 3726 of the present invention further can be formed by a printing process thereby increasing manufacturing precision without additional costs.

The top 3710 of the terminals 3706 are shown having the dielectric material 3708 formed thereon. The dielectric material 3708 can include gaps 3728 on the top 3710 that expose portions of the plateau 3712 from between the dielectric material 3708. The gaps 3728 are defined as a gap or absence of the dielectric material 3708 that exposes portions of the plateau 3712 from between the dielectric material 3708. The dielectric material 3708 can be designed to support the terminals 3706 during process and to increase structural rigidity in the integrated circuit packaging system 3700. The dielectric material 3708 is designed to increase reliability and structural rigidity in the form of the dielectric material 3708 filling the depressions 3714 and having smaller gaps 3728 on the plateau 3712.

On an upper surface 3730 of the dielectric material 3708 are traces 3732. The traces 3732 are formed within the gaps 3728 to electrically connect to and directly contact the plateau 3712 of the terminals 3706 exposed by the gaps 3728 between the dielectric material 3708. The traces 3732 are defined as conductive elements designed to redistribute electrical signals. The traces 3732 are designed to redistribute electrical signals in that they are generally electrically isolated, not excessively large to reduce the introduction of parasitic inductance and do not cover the entire upper surface 3730 of the dielectric material 3708.

It has been discovered that the traces 3732 of the present invention when coupled with the terminals 3706 and formed on the dielectric material 3708 enable efficient high thermal performance of the substrate 3709. The combination of the traces 3732, the dielectric material 3708, and the terminals 3706 has been discovered to have improved thermal and electrical properties when combined and utilized in the described fashion. Improving the integrated circuit packaging systems 3700 thermal performance increases the opportunity to utilize the present invention in multiple areas of high stress and high temperature applications.

Above the die pad 3704 is an integrated circuit 3734 depicted as a flip-chip die having an active side 3736. The active side 3736 is shown facing toward the die pad 3704.

It has been discovered that the die pad 3704 provides structural stability and decreased risk of warping and ultimately breakage or damage of the integrated circuit 3734. The structural support provided by the die pad 3704 has been discovered to increase reliability and performance of the integrated circuit packaging system 3700.

The active side 3736 of the integrated circuit 3734 is electrically connected to the traces 3732 with interconnects 3740 depicted as solder bumps. The solder bumps 3740 are shown in direct contact with the traces 3732 at various points along the trace 3732. The solder bumps 3740 can be connected over the gaps 3728, along the trace near the integrated circuit 3734, spaced at an optimal distance there between, or on a portion of the trace 3732 beyond the gaps 3728 and away from the integrated circuit 3734. The flip-chip die 3734 is large enough to overhang the traces 3732 and part of the dielectric material 3708.

It has been discovered that the traces 3732 provide improved electrical performance by allowing the utilization of smaller flip-chip dies 3734. This allows for greater process and design flexibility by allowing design flexibility of the traces 3732 to offset the largely fixed size of the integrated circuit 3734.

Around the integrated circuit 3734 the interconnects 3740 and the traces 3732 is an encapsulation 3742. The encapsulation 3742 can be glob top, film assist molding, or other encasement structure. On the dimpled surfaces 3724 are solder ball drops 3744. Employing solder ball drops 3744 has been discovered to increase uniform ball co-planarity and enhance board level reliability.

It has been discovered that utilizing the traces 3732 of the present invention in conjunction with the integrated circuit 3734 and the encapsulation 3742 decreases production costs and complexity by decreasing the size of flip-chip die 3734. Since the size and susceptibility of breakage or damage of the integrated circuit 3734 is substantially decreased a less expensive non-compression molding can be employed.

The flip-chip die 3734 can optionally be connected to the terminals 3706 directly with the interconnects 3740 having the interconnects 3740 in direct contact with the terminals 3706 and isolated from the traces 3732. The flip-chip die 3734 can further employ a hybrid approach allowing for some connections to the terminals 3706 to be direct and others to be made through the traces 3732.

Multiple layers of the traces 3732 and the dielectric material 3708 can be formed to enable signal routing with many more connection points. The traces 3732 can be fused together to enable power, ground, or signals to be routed to multiple terminals 3706 or multiple solder bumps 3740. The terminals 3706 are depicted in a multi row configuration designed to efficiently utilize the full space below the integrated circuit packaging system 3700 size and enables yet smaller flip-chip dies 3734. Wire-bonded die can also be stacked upon the integrated circuit 3734 and connected to the traces 3732 with bond wires to form hybrid flip-chip die and wire-bonded die stacks.

Figure 38:
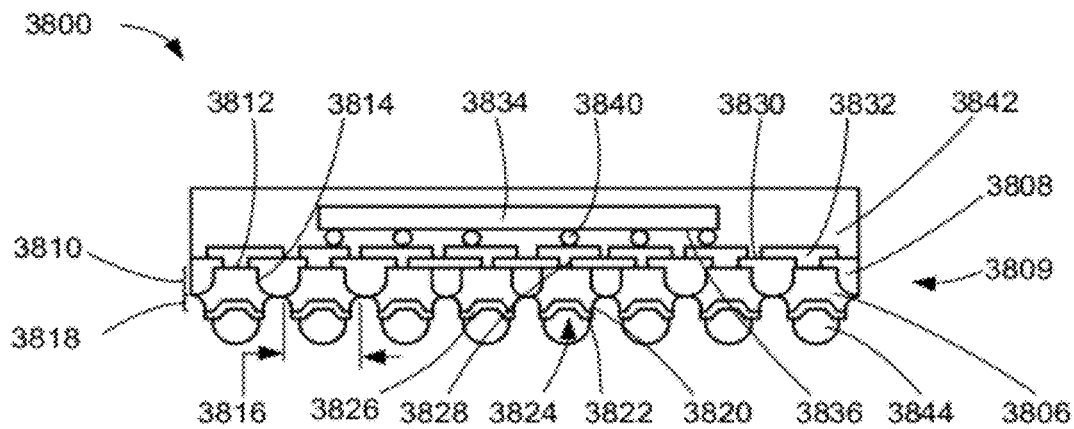
FIG. 38 is a cross-sectional view of an integrated circuit packaging system in a thirteenth embodiment of the present invention.

Referring now to FIG. 38, therein is shown a cross-sectional view of an integrated circuit packaging system 3800 in a thirteenth embodiment of the present invention. The integrated circuit packaging system 3800 can include terminals 3806. The terminals 3806 are defined as a conductor designed to provide clearance for structures above the terminal and having lateral isolation from direct contact with other terminals; for this reason the terminals 3806 are also known as standoff terminals.

The terminals 3806 are shown having similar widths and heights. Above the terminals 3806 is a dielectric material 3808. The dielectric material 3808 is formed in direct contact with the terminals 3806. The dielectric material 3808 is shown formed between the terminals 3806. The dielectric material 3808 rigidly couples the terminals 3806 in place to form a substrate 3809.

The terminals 3806 are shown having a top 3810. The top 3810 of the terminals 3806 can include a plateau 3812 and also include depressions 3814 extending from the plateau 3812 to a maximum width 3816 of the terminals 3806. The dielectric material 3808 is in direct contact with the top 3810 of the terminals 3806 from the plateau 3812 to the maximum width 3816 of the terminals 3806 and fills in the depressions 3814.

Below the maximum width 3816 of the terminals 3806 is a bottom portion 3818 extending down from the maximum width 3816 of the terminals 3806. The bottom portion 3818 can include a dent 3820 extending down from the maximum width 3816 to a base 3822 of the bottom portion 3818. The base 3822 is depicted as planar or flat. In the bottom portion 3818 and centered within the base 3822 are dimpled surfaces 3824.

The dimpled surfaces 3824 can be rounded as shown in the dimpled surfaces 3824 of the terminals 3806.

Covering some of the bottom portion 3818 is a contact layer 3826. The contact layer 3826 is defined as a material that can rigidly join to the surface of the terminals 3806 and form electrical connections with other components and capable of being reflowed to form firm connections. The contact layer 3826 can be a solder paste, a layer containing tin or lead, or a conductive high temperature polymer. The contact layer 3826 can cover some of the bottom portion 3818 of the terminals 3806 with an even conformal layer with a uniform cross-section.

It has been discovered that the contact layer 3826 formed on side surfaces within the dimpled surfaces 3824 increase solder coverage. Increasing solder coverage with the terminals 3806 increases board level reliability and performance. The contact layer 3826 of the present invention further can be formed by a printing process thereby increasing manufacturing precision without additional costs.

The top 3810 of the terminals 3806 are shown having the dielectric material 3808 formed thereon. The dielectric material 3808 can include gaps 3828 on the top 3810 that expose portions of the plateau 3812 from between the dielectric material 3808. The gaps 3828 are defined as a gap or absence of the dielectric material 3808 that exposes portions of the plateau 3812 from between the dielectric material 3808. The dielectric material 3808 can be designed to support the terminals 3806 during process and to increase structural rigidity in the integrated circuit packaging system 3800. The dielectric material 3808 is designed to increase reliability and structural rigidity in the form of the dielectric material 3808 filling the depressions 3814 and having smaller gaps 3828 on the plateau 3812.

On an upper surface 3830 of the dielectric material 3808 are traces 3832. The traces 3832 are formed within the gaps 3828 to electrically connect to and directly contact the plateau 3812 of the terminals 3806 exposed by the gaps 3828 between the dielectric material 3808. The traces 3832 are defined as conductive elements designed to redistribute electrical signals. The traces 3832 are designed to redistribute electrical signals in that they are generally electrically isolated, not excessively large to reduce the introduction of parasitic inductance and do not cover the entire upper surface 3830 of the dielectric material 3808.

It has been discovered that the traces 3832 of the present invention when coupled with the terminals 3806 and formed on the dielectric material 3808 enable efficient high thermal performance of the substrate 3809. The combination of the traces 3832, the dielectric material 3808, and the terminals 3806 has been discovered to have improved thermal and electrical properties when combined and utilized in the described fashion. Improving the integrated circuit packaging systems 3800 thermal performance increases the opportunity to utilize the present invention in multiple areas of high stress and high temperature applications.

Above the terminals 3806 is an integrated circuit 3834 depicted as a flip-chip die having an active side 3836. The active side 3836 is shown facing toward the terminals 3806.

It has been discovered that the terminals 3806 coupled with the dielectric material 3808 provides structural stability and decreased risk of warping and ultimately breakage or damage of the integrated circuit 3834. The structural support provided by the terminals 3806 and the dielectric material 3808 has been discovered to increase reliability and performance of the integrated circuit packaging system 3800.

The active side 3836 of the integrated circuit 3834 is electrically connected to the traces 3832 with interconnects 3840 depicted as solder bumps. The solder bumps 3840 are shown in direct contact with the traces 3832 at various points along the trace 3832. The solder bumps 3840 can be connected over the gaps 3828, along the trace near the integrated circuit 3834, spaced at an optimal distance there between, or on a portion of the trace 3832 beyond the gaps 3828 and away from the integrated circuit 3834. The flip-chip die 3834 is large enough to overhang the traces 3832 and part of the dielectric material 3808.

It has been discovered that the traces 3832 provide improved electrical performance by allowing the utilization of smaller flip-chip dies 3834. This allows for greater process and design flexibility by allowing design flexibility of the traces 3832 to offset the largely fixed size of the integrated circuit 3834.

Around the integrated circuit 3834 the interconnects 3840 and the traces 3832 is an encapsulation 3842. The encapsulation 3842 can be glob top, film assist molding, or other encasement structure. On the dimpled surfaces 3824 are solder ball drops 3844. Employing solder ball drops 3844 has been discovered to increase uniform ball co-planarity and enhance board level reliability.

It has been discovered that utilizing the traces 3832 of the present invention in conjunction with the integrated circuit 3834 and the encapsulation 3842 decreases production costs and complexity by decreasing the size of flip-chip die 3834. Since the size and susceptibility of breakage or damage of the integrated circuit 3834 is substantially decreased a less expensive non-compression molding can be employed.

The flip-chip die 3834 can optionally be connected to the terminals 3806 directly with the interconnects 3840 having the interconnects 3840 in direct contact with the terminals 3806 and isolated from the traces 3832. The flip-chip die 3834 can further employ a hybrid approach allowing for some connections to the terminals 3806 to be direct and others to be made through the traces 3832.

Multiple layers of the traces 3832 and the dielectric material 3808 can be formed to enable signal routing with many more connection points. The traces 3832 can be fused together to enable power, ground, or signals to be routed to multiple terminals 3806 or multiple solder bumps 3840. The terminals 3806 are depicted in a multi row configuration designed to efficiently utilize the full space below the integrated circuit packaging system 3800 size and enables yet smaller flip-chip dies 3834. Wire-bonded die can also be stacked upon the integrated circuit 3834 and connected to the traces 3832 with bond wires to form hybrid flip-chip die and wire-bonded die stacks.

Figure 39:
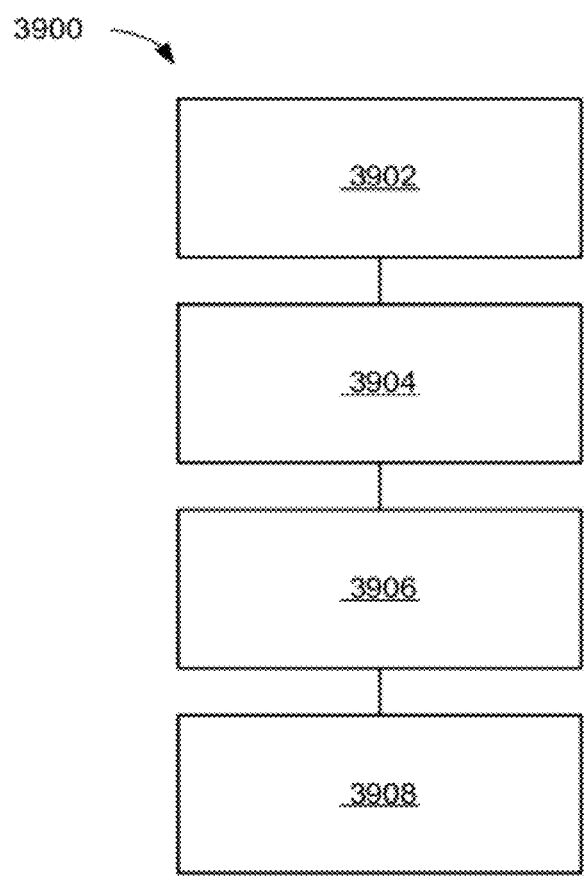
FIG. 39 is a flow chart of a method of manufacture of the integrated circuit packaging system of FIG. 1 in a further embodiment of the present invention.

Referring now to FIG. 39, therein is shown a flow chart of a method 3900 of manufacture of the integrated circuit packaging system 100 of FIG. 1 in a further embodiment of the present invention. The method 3900 includes: providing a terminal having a top with a depression in a block 3902; applying a dielectric material in the depression, the dielectric material having a gap formed therein and exposing a portion of the top therefrom in a block 3904; forming a trace within the gap and in direct contact with the top, the trace extending laterally over an upper surface of the dielectric material in a block 3906; and connecting an integrated circuit to the terminal through the trace in a block 3908.

Thus, it has been discovered that the terminal system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a terminal having a top with a depression;
   applying a dielectric material in the depression, the dielectric material having a gap formed therein and exposing a portion of the top therefrom is in direct contact with a peripheral portion at a plateau of the terminal;
   forming a trace within the gap and in direct contact with the top, the trace extending laterally over an upper surface of the dielectric material; and
   connecting an integrated circuit to the terminal through the trace.

2. The method as claimed in claim 1 further comprising:
   providing a die pad; and
   applying a contact layer below the die pad; and
   wherein:
   forming the trace includes forming a perimeter trace around the die pad; and further comprising:
   mounting the integrated circuit to the die pad.

3. The method as claimed in claim 1 further comprising mounting the integrated circuit above the trace extending beyond the integrated circuit.

4. The method as claimed in claim 1 wherein:
   forming the trace includes forming multiple traces; and further comprising:
   mounting the integrated circuit above the multiple traces terminating at a non-uniform distance from the integrated circuit.

5. The method as claimed in claim 1 further comprising mounting the integrated circuit above the trace extending below the integrated circuit from the terminal beyond the integrated circuit.

6. A method of manufacture of an integrated circuit packaging system comprising:
   providing a terminal having a top with a plateau and a depression extending from the plateau to a maximum width, the terminal further having a bottom portion with a dent extending from the maximum width to a base;
   applying a contact layer directly to the base of the terminal;
   forming a dielectric material in the depression and in direct contact with the plateau and extending to the maximum width, the dielectric material having a gap formed therein and exposing a portion of the plateau therefrom is in direct contact with a peripheral portion at a plateau of the terminal;
   forming a trace within the gap and in direct contact with the plateau, the trace extending laterally over an upper surface of the dielectric material;
   connecting an integrated circuit to the terminal through the trace; and
   encapsulating the trace and the integrated circuit with an encapsulation.

7. The method as claimed in claim 6 wherein applying the contact layer includes applying the contact layer directly to a portion of the dent of the terminal near the base leaving a portion of the dent near the maximum width exposed.

8. The method as claimed in claim 6 further comprising forming a dimpled surface in the terminal centered in the base.

9. The method as claimed in claim 6 further comprising forming solder balls below the base and attached to the contact layer.

10. The method as claimed in claim 6 wherein connecting the integrated circuit to the terminal includes connecting the integrated circuit with a bond wire or with a solder ball.

* * * * *